US006534702B1

(12) United States Patent
Makita et al.

(10) Patent No.: US 6,534,702 B1
(45) Date of Patent: Mar. 18, 2003

(54) SOLAR BATTERY MODULE ARRANGING METHOD AND SOLAR BATTERY MODULE ARRAY

(75) Inventors: Hidehisa Makita, Kyotanabe; Kimitoshi Fukae; Akiharu Takabayashi, both of Nara; Satoru Shiomi, Kyotanabe; Shigenori Itoyama, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/188,319

(22) Filed: Nov. 10, 1998

(30) Foreign Application Priority Data

Nov. 13, 1997 (JP) ............................................. 9-311889

(51) Int. Cl.[7] ........................ H01L 31/042; E04D 13/18
(52) U.S. Cl. ........................ 136/244; 136/291; 126/621; 126/622; 126/623; 126/906; 52/173.3; 438/66; 438/67
(58) Field of Search ............................... 136/244, 291; 126/621, 622, 623, 906; 52/173.3; 438/66, 67

(56) References Cited

U.S. PATENT DOCUMENTS

| 3,562,020 A | * | 2/1971 | Blevins ..................... 136/244 |
| 4,428,360 A | * | 1/1984 | Cohen ........................ 126/622 |
| 5,437,735 A | * | 8/1995 | Younan et al. ............... 136/244 |
| 5,478,407 A | * | 12/1995 | Dorison et al. .............. 136/244 |
| 5,509,246 A | * | 4/1996 | Roddy ......................... 52/533 |
| 5,590,495 A | * | 1/1997 | Bressler et al. ............ 52/173.3 |
| 5,990,414 A | * | 11/1999 | Posnansky ................... 136/244 |
| 6,331,671 B1 | * | 12/2001 | Makita et al. ............... 136/244 |
| 2001/0050101 A1 | * | 12/2001 | Makita et al. ............... 136/244 |

FOREIGN PATENT DOCUMENTS

EP 917210 A2 * 5/1999

OTHER PUBLICATIONS

"Reference of roofing materials, sheathing materials, and walls facing outside", Notification No. 109 of the Ministry of Construction, 45th ed., Architecture Inst. of Japan (1996). (month unknown).
Ch. Roecker, et al., "Demosite and PV Building Integration at the LESO–PB", 12th European Photovoltaic Solar Energy Conf., Amsterdam, pp. 1137–1140 (1994). (month unknown).

* cited by examiner

Primary Examiner—Alan Diamond
(74) Attorney, Agent, or Firm—Fitzpatrick, Cella, Harper & Scinto

(57) ABSTRACT

To optimally arrange roofing material integrated solar battery modules having a rectangular form and same size on a roof setting surface, an arrangement range in which the solar battery modules can be arranged on the roof setting surface is determined. An arranging direction of the solar battery modules is determined. The number of solar battery modules which can be arranged almost horizontally in a line in the determined arranging direction and within the arrangement range is calculated. Solar battery modules of a line in a number not more than the calculated number are combined to form a solar battery module group. The solar battery module groups are arranged to set a center of the solar battery module group within the determined arrangement range and near a line almost vertically dividing the surface into two parts. The above operations are repeated a number of times corresponding to the number of lines of solar battery module groups which can be vertically arranged in the determined arranging direction and within the arrangement range.

28 Claims, 27 Drawing Sheets

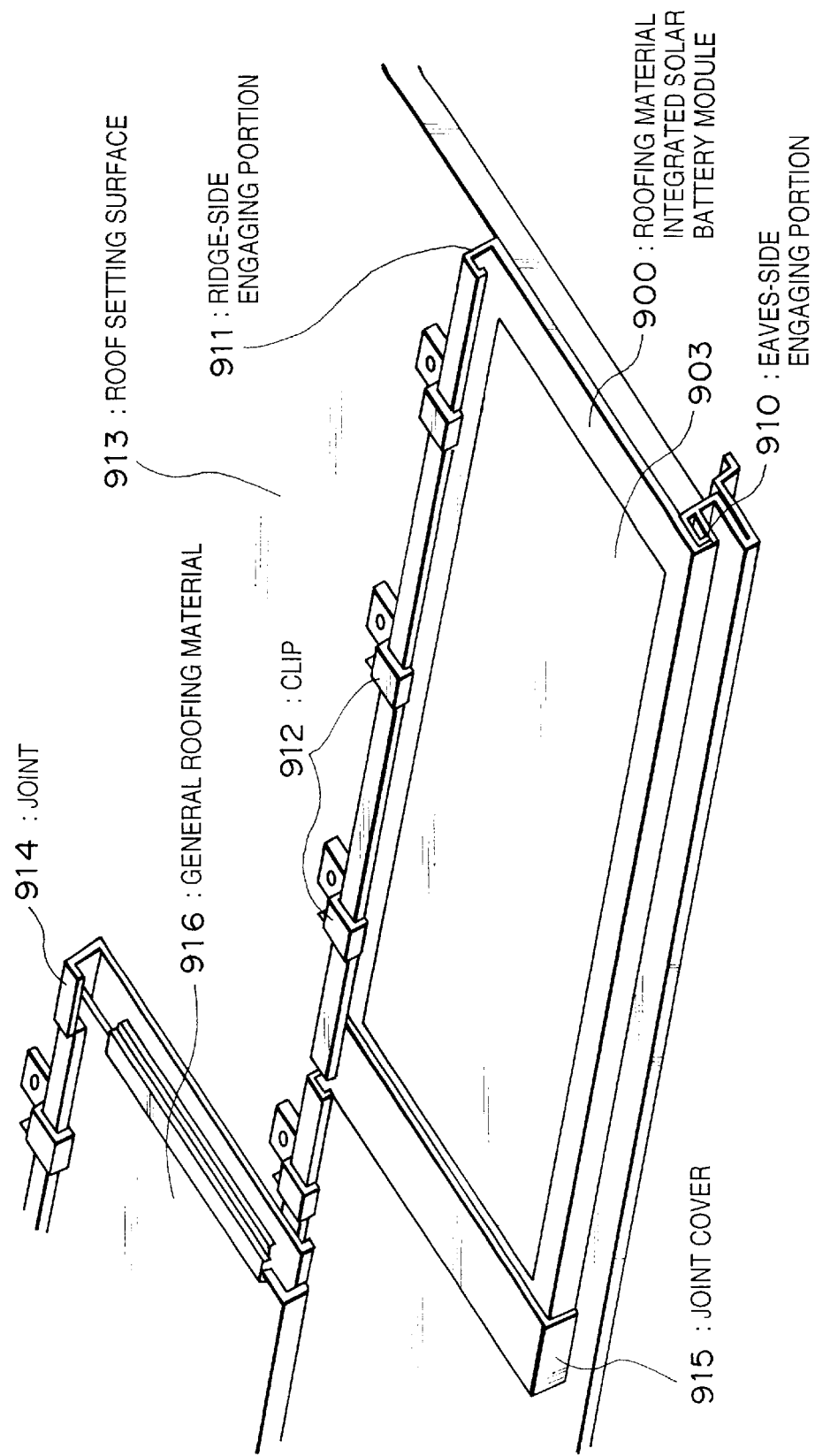

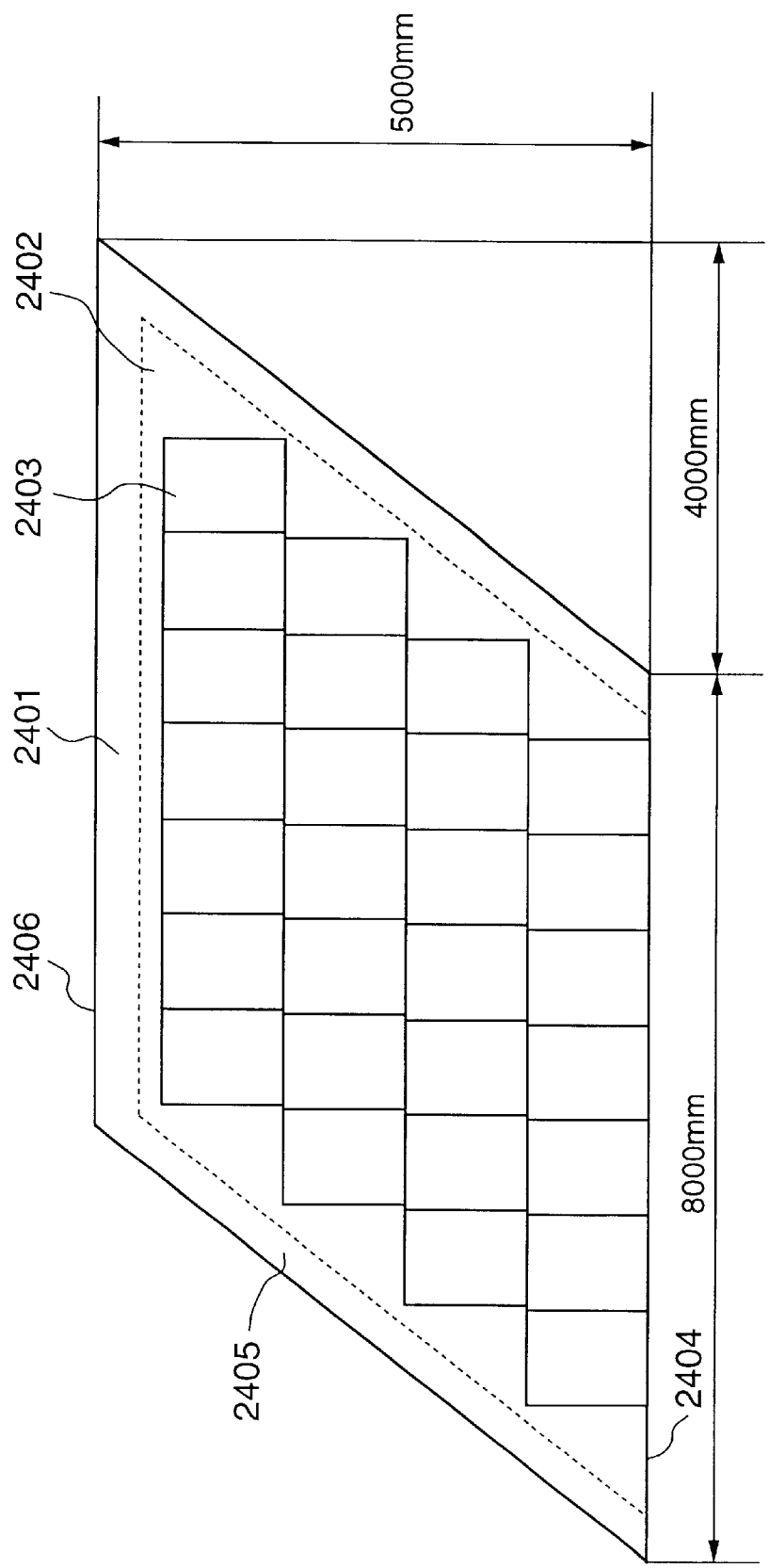

| | SHAPE OF ROOF SURFACE | SOLAR BATTERY MODULE | ARRANGING METHOD | MAXIMUM SETTING NUMBER | ROOF OCCUPATION RATIO (%) |
|---|---|---|---|---|---|
| FIRST EMBODIMENT | TRAPEZOIDAL | ROOFING MATERIAL INTEGRATED SOLAR BATTERY MODULE | PRESENT INVENTION | 74 | 77.4 |
| SECOND EMBODIMENT | | | PRESENT INVENTION | 72 | 75.3 |
| COMPARATIVE EXAMPLE 1 | | | SHIFT-ROOFING METHOD | 59 | 61.7 |
| COMPARATIVE EXAMPLE 2 | | | DUTCH-LAP METHOD | 62 | 64.8 |
| THIRD EMBODIMENT | TRIANGULAR | ROOFING MATERIAL INTEGRATED SOLAR BATTERY MODULE | PRESENT INVENTION | 37 | 63.7 |
| COMPARATIVE EXAMPLE 3 | | | SHIFT-ROOFING METHOD | 24 | 41.3 |
| COMPARATIVE EXAMPLE 4 | | | DUTCH-LAP METHOD | 29 | 49.9 |
| FOURTH EMBODIMENT | TRAPEZOIDAL | FRAME MOUNTED SOLAR BATTERY MODULE | PRESENT INVENTION | 22 | 56.9 |
| COMPARATIVE EXAMPLE 5 | | | CONVENTIONAL METHOD | 20 | 51.7 |

MAXIMUM SETTING NUMBER : MAXIMUM NUMBER OF SOLAR BATTERY MODULES WHICH CAN BE SET IN ALLOWABLE SETTING RANGE ON ROOF SETTING SURFACE

ROOF OCCUPATION RATIO : ( ( AREA OF SOLAR BATTERY MODULES ON ROOF SETTING SURFACE / AREA OF ROOF SETTING SURFACE ) × 100%

FIG. 25

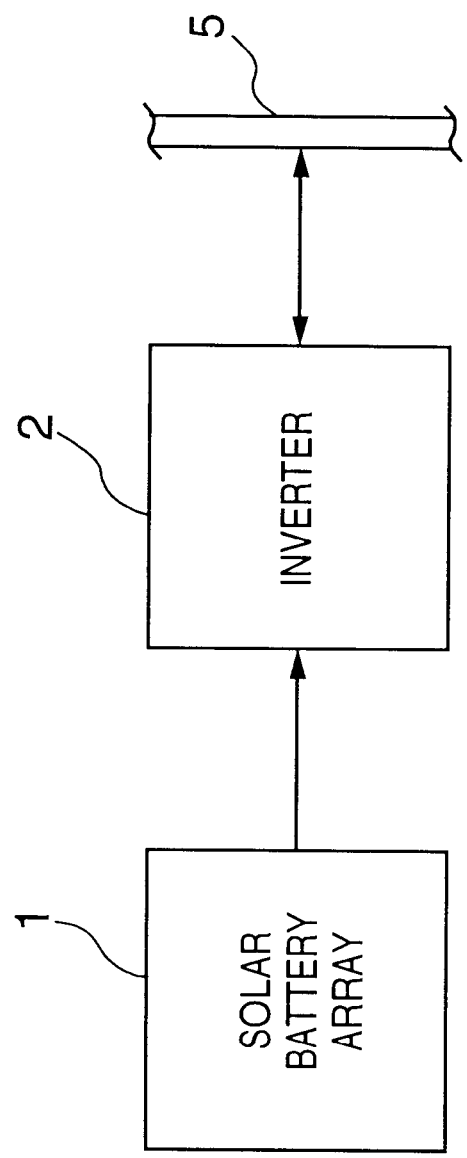

SOLAR BATTERY MODULE ARRANGING METHOD AND SOLAR BATTERY MODULE ARRAY

BACKGROUND OF THE INVENTION

1. Field of the Invention

The present invention relates to a solar battery module arranging method and a solar battery module array and, more particularly, to an arranging method for arranging solar battery modules having a rectangular form and same size on a setting surface such as a roof, and a solar battery module array arranged by the arranging method.

2. Description of the Related Art

As a method for arranging a roofing material and, more specifically, a stepping roof or Bermuda-type roof material on a roof surface, the dutch-lap method (FIG. 2) or the Mechigai-roofing method/shift-roofing method (FIG. 3) is used. These roofing material arranging methods are advantageous in obtaining a good outer appearance because roofing materials 201 are arranged at a predetermined joint shift width 205 from eaves 202 at the lower end side of the roof to a ridge 203 as at the upper end side of the roof. In these arranging methods, for weathering, the joint portions are shifted at a period corresponding to three lines of the roofing materials in the vertical direction (the distance at which the joints are shifted will be referred to as a "shift width" hereinafter). The roofing materials 201 are cut along a roof boundary portion 204 for corner-ridge cover or verge cover. The "shift-roofing method" is a method of regularly horizontally changing the positions of joints of the roofing materials forming lines in units of lines of the roofing materials.

However, direct application of the above roofing material arranging methods to roofing material integrated solar battery modules results in the following disadvantages.

1. Since a roofing material integrated solar battery module cannot be cut, the setting place for the roofing material integrated solar battery modules is limited. For, e.g., a hip roof, the allowable setting range narrows from the eaves to the ridge, so a number of roofing material integrated solar battery modules cannot be arranged.
2. When the roofing material integrated solar battery modules are not regularly arranged, the outer appearance of the roof is degraded.
3. Electrical wiring is difficult.

For example, in FIGS. 2 and 3, general roofing materials 201 each having a cover width of 200 mm and a length of 2,000 mm are arranged on a trapezoidal roof surface with a 5,000-mm long upper-end roof side (ridge 203), a 12,000-mm long lower-end roof side (eaves 202), and a 4,500-mm long roof inclination by shift-roofing (FIG. 2) and dutch-lap method (FIG. 3).

In both FIGS. 2 and 3, at the roof boundary 204, the general roofing materials 201 having a length of 2,000 mm project from the roof surface, so the general roofing materials 201 are cut along the roof boundary 204. FIGS. 4 and 5 show states wherein roofing material integrated solar battery modules each having a cover width of 200 mm and a length of 2,000 mm, i.e., the same shape as that of the general roofing material 201, are arranged on this roof surface. A simple algorithm for arrangement of roofing material integrated solar battery modules will be described below.

In FIG. 4, letting A be the length of the inclination direction in the allowable setting range, the number of lines of roofing material integrated solar battery modules 401 which can be set is given as the maximum integer satisfying the following inequality:

number of lines $\leq A/$(cover width of roofing material integrated solar battery module)

In FIG. 4, the number of lines is 19.

The allowable maximum setting number of the roofing material integrated solar battery modules 401 on the first line counted from the eaves is calculated. Letting B be the common length of an upper-side module line 407 and a lower-side module line 408 in the allowable setting range of the target line (in FIG. 4, the common length equals the length of the upper-side module line 407), the allowable maximum setting number is given as the maximum integer satisfying the following inequality:

allowable maximum setting number $\leq B/$(length of roofing material integrated solar battery module)

In FIG. 4, the allowable maximum setting number for the first line counted from the eaves 202 is 4.

For subsequent lines, the roofing material integrated solar battery modules 401 are arranged while keeping the shift width 205. Four roofing material integrated solar battery modules 401 are arranged on each line from the eaves 202. On the sixth line, the roofing material integrated solar battery module 401 at the right end falls outside the allowable setting range and cannot be arranged. On the seventh line, the roofing material integrated solar battery module 401 at the left end falls outside the allowable setting range and cannot be arranged. For these reasons, the number of roofing material integrated solar battery modules 401 set on each of the sixth and seventh lines is 3. Similarly, two roofing material integrated solar battery modules 401 are arranged on each of the eighth to 18th lines, and one roofing material integrated solar battery module 401 is arranged on the 19th line.

In FIG. 5 as well, the same arranging method as described above is used except that the shift width 205 decreases to ½ the length of the roofing material integrated solar battery module 401. In this case, the number of set roofing material integrated solar battery modules 401 is 4 for the first, third, and fifth lines, 3 for the second, fourth, sixth, eighth, 10th, and 12th lines, 2 for the seventh, ninth, 11th, 13th, 15th, 17th, and 19th lines, and 1 for the 14th, 16th, and 18th lines.

In the arranging methods shown in FIGS. 4 and 5, the roof area other than the area occupied by solar battery modules is large. For this reason, a number of solar battery modules cannot be arranged (the above-mentioned problem 1). Additionally, since the solar battery modules are irregularly arranged (FIG. 5), the outer appearance is not good (the above-mentioned problem 2). In the arranging methods shown in FIGS. 4 and 5, since the distance between roofing material integrated solar battery modules 401 on adjacent lines is large, a lot of connection cables 406 are required to connect the connectors of the solar battery modules, resulting in low execution efficiency and high cost (the above-mentioned problem 3).

SUMMARY OF THE INVENTION

It is an object of the present invention to solve the above problems and provide a solar battery module arranging method for optimally arranging solar battery modules having a rectangular form and same size on a setting surface.

In order to achieve the above object, according to the present invention, there is provided an arranging method for arranging solar battery modules having a rectangular form and same size on a surface, comprising the steps of determining an arrangement range in which the solar battery modules can be arranged on the surface; determining an arranging direction of the solar battery modules; calculating the number of solar battery modules which can be arranged substantially horizontally in a line in the determined arranging direction and within the arrangement range; combining solar battery modules of a line in a number not more than the calculated number to form a solar battery module group; and arranging the solar battery module group so as to set the center of the solar battery module group within the determined arrangement range and near a line substantially vertically dividing the surface into two parts.

It is another object of the present invention to provide a solar battery module array arranged by the above solar battery module arranging method.

In order to achieve the above object, according to the present invention, there is provided an array of solar battery modules having a rectangular form and same size which is arranged on a surface by the arranging method of the present invention, wherein the solar battery modules are electrically connected.

According to the solar battery module arranging method and solar battery module array, a larger number of solar battery modules can be arranged on the setting surface to increase the light-receiving area to be used for solar power generation, and the solar battery modules can be easily electrically connected to each other without degrading the outer appearance of the setting surface.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 9A and 9B are sectional and perspective views, respectively, showing the arrangement of a roofing material integrated solar battery module;

FIG. 24 is a view showing the solar battery module arranged state in the sixth embodiment;

FIG. 25 is a table showing evaluation results of maximum setting numbers and roof occupation ratios of the first to fourth embodiments and comparative examples thereof; and FIG. 26 is a block diagram showing the arrangement of a solar power generation apparatus.

DETAILED DESCRIPTION OF THE PREFERRED EMBODIMENTS

Figure 1:
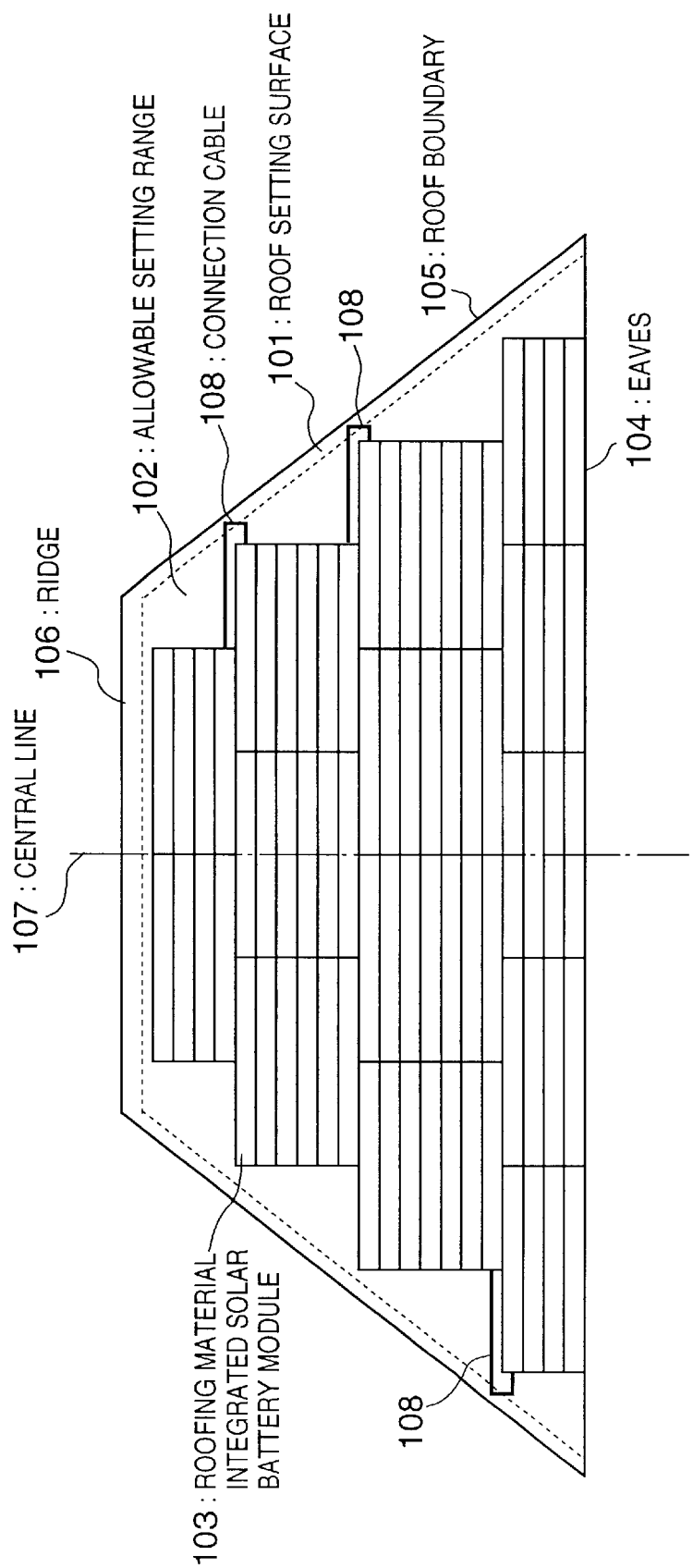
FIG. 1 is a view for explaining a solar battery module arranging method according to the present invention.

As the characteristic feature of the present invention, the number of lines of roofing material integrated solar battery modules 103 and the maximum setting number of roofing material integrated solar battery modules 103 on each line on a roof setting surface 101 are calculated, and a roofing material integrated solar battery module group formed by connecting the lines is arranged almost at the central portion of the roof setting surface 101 (FIG. 1).

A method for calculating the number of lines of roofing material integrated solar battery modules 1803 and the maximum setting number of roofing material integrated solar battery modules 1803 on each line on a roof setting surface 1801 will be described with reference to FIG. 18.

Letting A be the length of the inclination direction of an allowable setting range 1802, the number of lines of roofing material integrated solar battery modules 1803 is given by the maximum integer satisfying the following inequality:

number of lines $\leq A/$(cover width W of roofing material integrated solar battery module)

Figure 18:
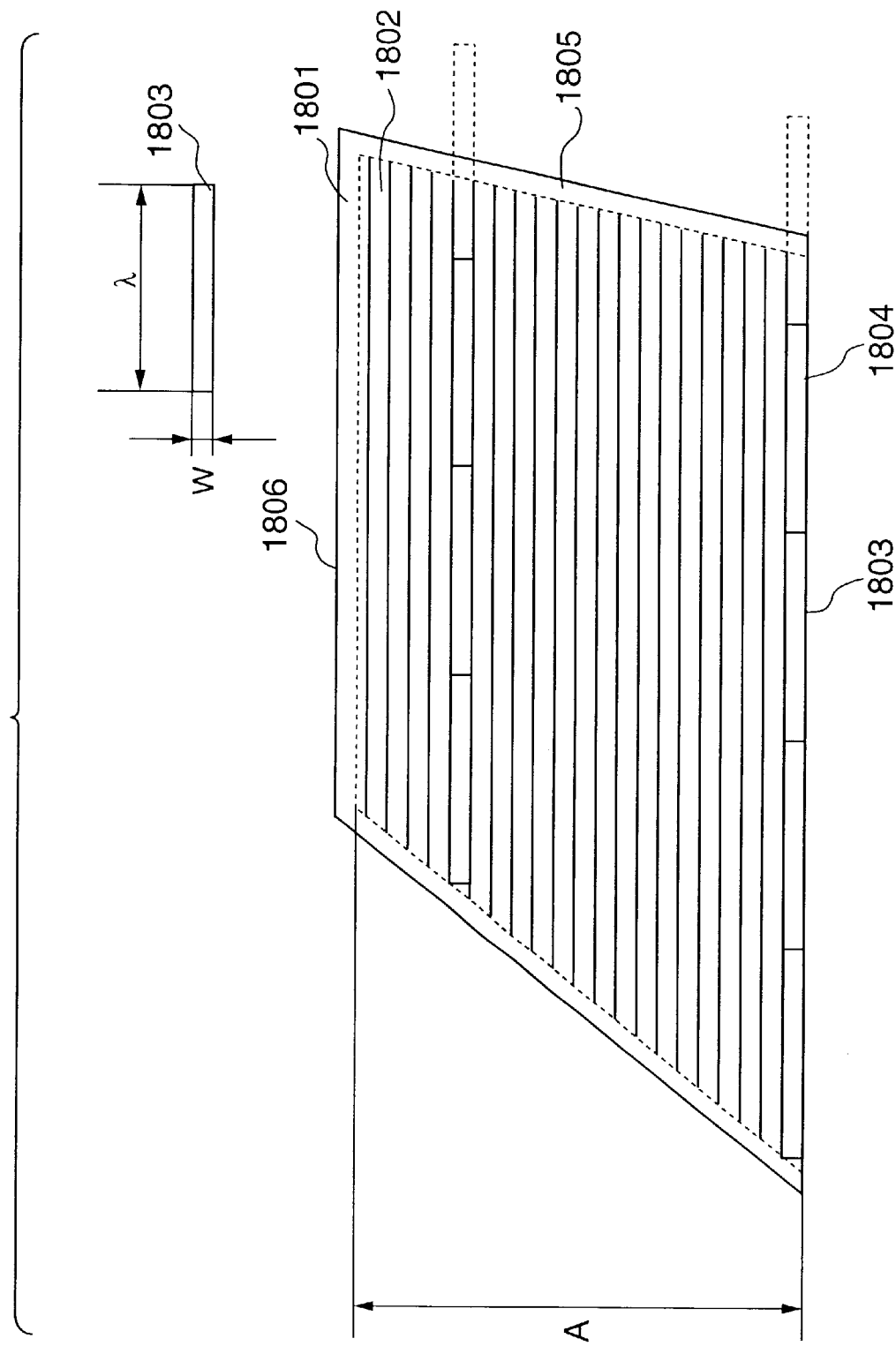
FIG. 18 is a view for explaining a method for calculating the allowable setting number of solar battery modules and the allowable setting number for each line.

In FIG. 18, the number of lines is 21.

Letting B be the common length of an upper-side module line and a lower-side module line within the allowable setting range 1802 of the target line, the maximum setting number of roofing material integrated solar battery modules

1803 on each line is given as the maximum integer satisfying the following inequality:

maximum setting number≦*B*/(length λ of roofing material integrated solar battery module)

In FIG. 18, the maximum setting number is 4 for the first line counted from eaves 1804 and 3 for the 17th line counted from the eaves 1804.

The lengths A and B can be easily manually calculated when the roof has a simple shape. Even for a roof with a complex shape, the lengths can be easily obtained by using, e.g., CAD.

Figure 6:
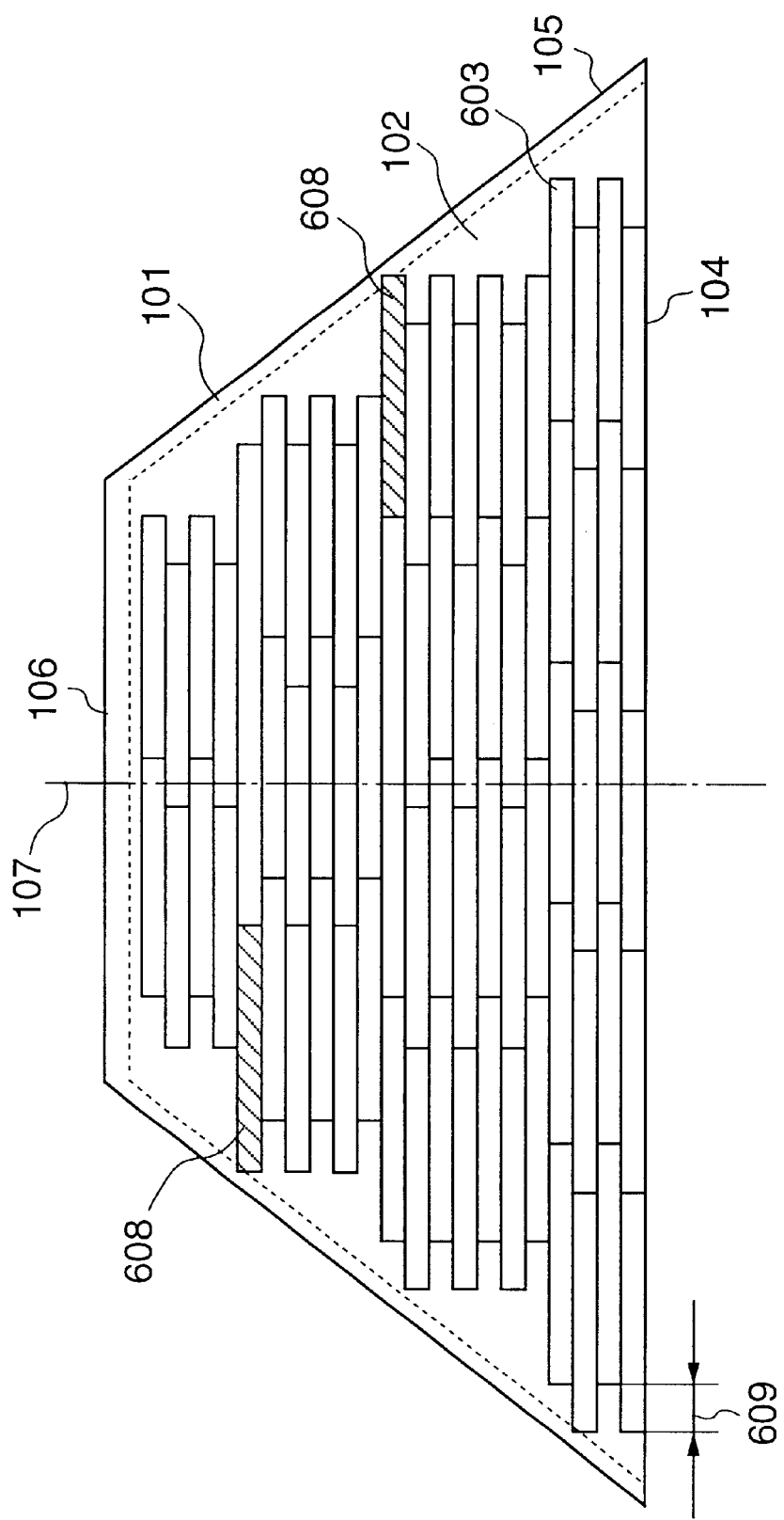
FIG. 6 is a view showing the arranged state according to the invention obtained upon shift-roofing.
Figure 7:
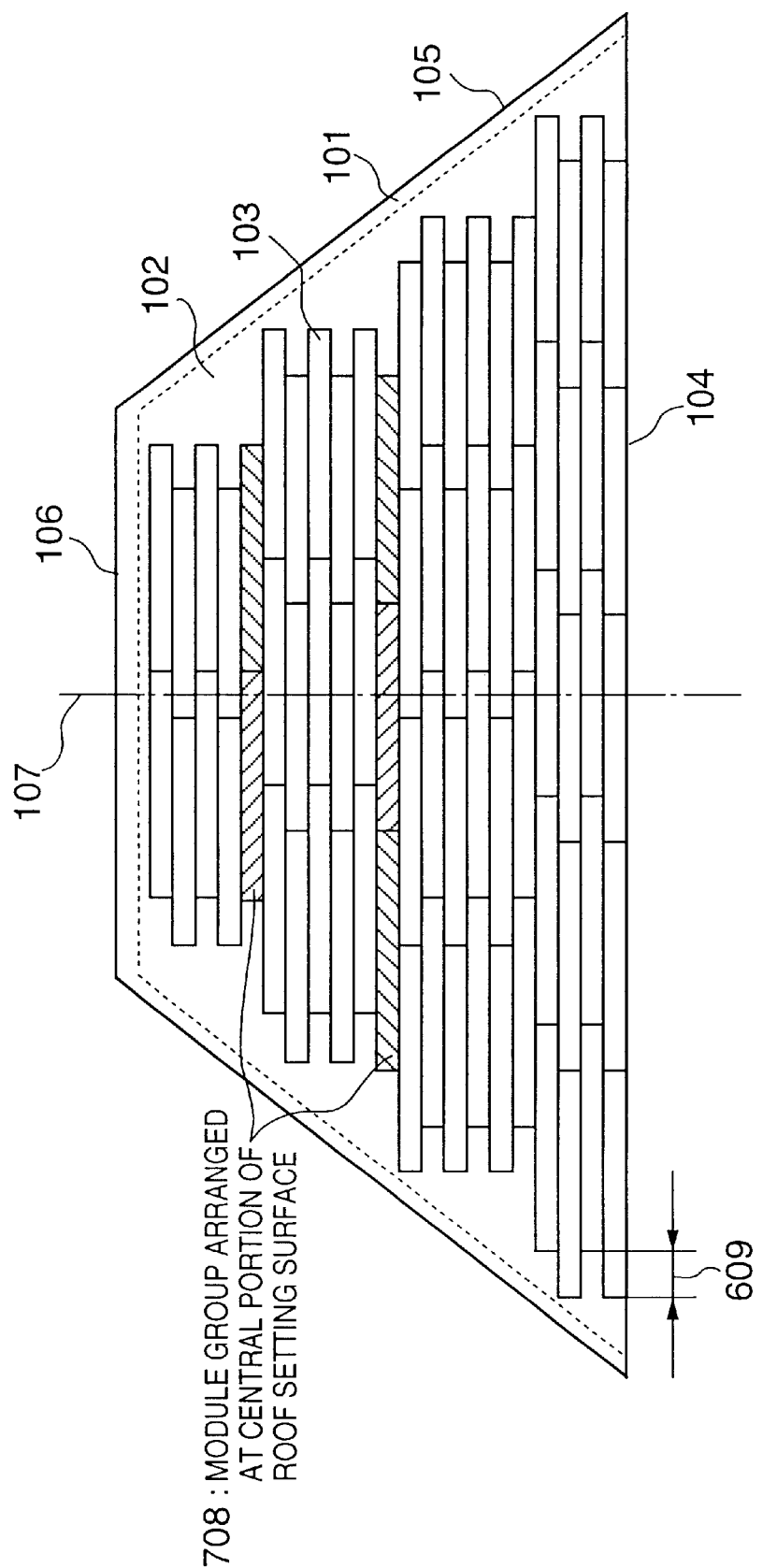
FIG. 7 is a view showing a state wherein solar battery modules projecting from the allowable setting range are removed in the arranged state shown in FIG. 6, and the solar battery modules on those lines are rearranged.

When the roofing material integrated solar battery modules 103 and general roofing materials are to be shifted, the module groups of the respective lines are shifted to the left or right side with respect to a central line 107 to obtain a predetermined shift width 609 for weathering (FIG. 6). When the module groups of the respective lines are shifted with respected to the central line 107, the roofing material integrated solar battery modules 103 move to the roof boundaries. When the roofing material integrated solar battery module 103 does not project from an allowable setting range 102 (603), this state need not change. If the roofing material integrated solar battery module 103 projects from the allowable setting range 102, a roofing material integrated module 608 projecting from the module group of that line is removed, and a remaining module group 708 is arranged again at the central portion of the roof setting surface 101 in consideration of shift (FIG. 7).

Figure 19:
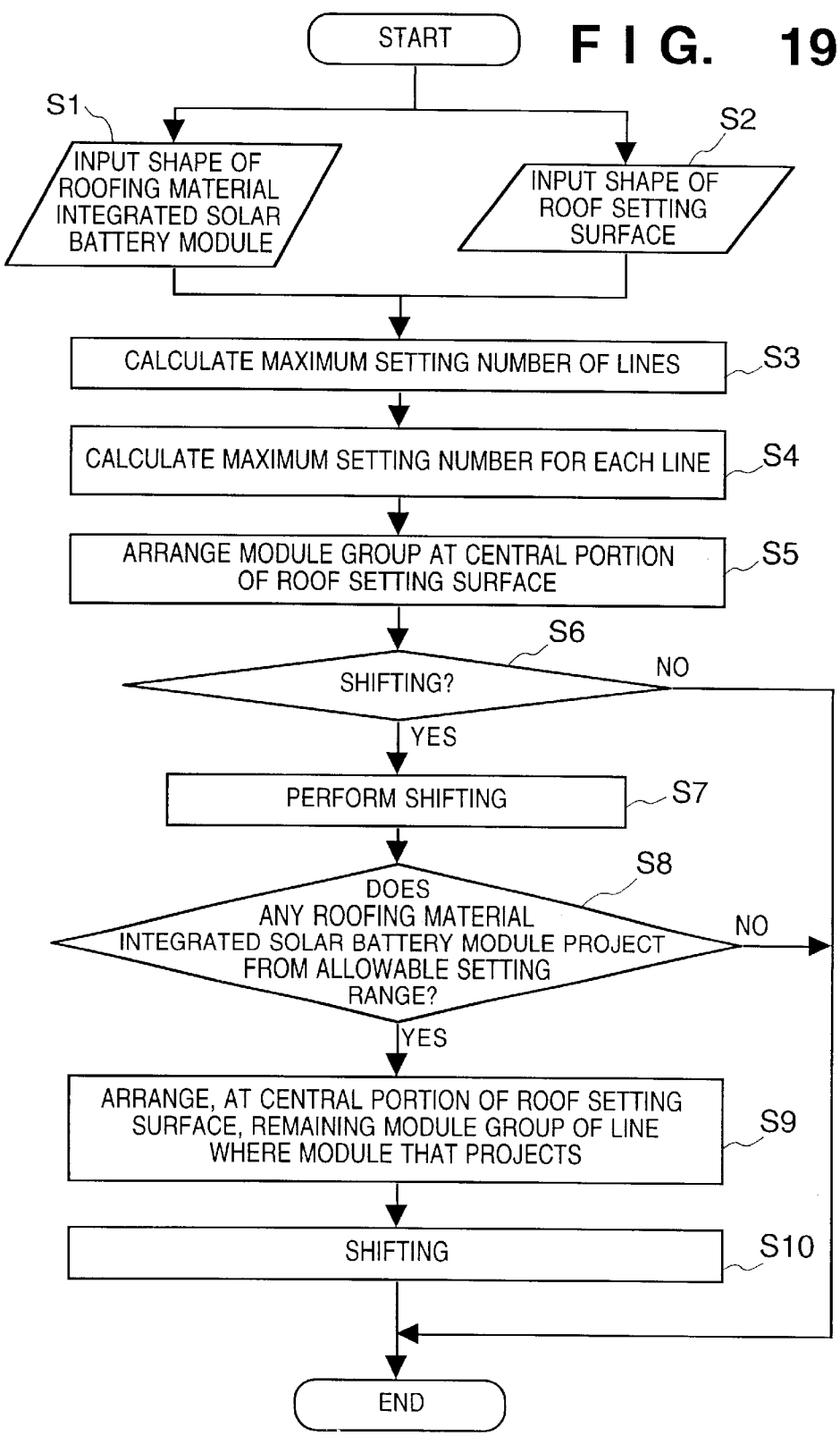
FIG. 19 is a flow chart showing the procedure of the solar battery module arranging method of the present invention.

FIG. 19 is a flow chart showing the above series of operations. Referring to FIG. 19, in steps S1 and S2, the shape of the roofing material integrated solar battery module 103 and the shape of the roof setting surface 101 are input. In steps S3 and S4, the maximum setting number of lines of roofing material integrated solar battery modules 103 and the maximum setting number of roofing material integrated solar battery modules 103 on each line are calculated. On the basis of these calculation results, module groups are arranged at the central portion of the roof setting surface 101 in step S5. No shift-roofing is required, the operation is ended in step S6 (FIG. 1). If shift-roofing is necessary, shift-roofing is performed in step S7. If no roofing material integrated solar battery modules 103 project from the allowable setting range 102 upon shift-roofing, processing is ended in step S8. If the roofing material integrated module 608 projects from the allowable setting range 102, the projecting roofing material integrated solar battery module 103 is removed, and the remaining module group is arranged at the central portion of the roof setting surface 101 in step S9. Shift-roofing is performed in step S10, thus completing the arrangement shown in FIG. 7.

According to the above roofing material integrated solar battery module arranging method, the following functions can be expected.

(1) A number of roofing material integrated solar battery modules 103 can be more efficiently arranged on the roof setting surface 101 as compared to the conventional arranging method.

(2) Since the solar battery module groups can be arranged symmetrically with respect to the central line 107 of the roof setting surface 101, a good outer appearance of the roof can be obtained.

(3) Since the solar battery module groups are arranged at the central portion of the roof setting surface 101, a space for an edge cover can be ensured to improve the execution efficiency.

(4) The number of connection cables 108 required can be decreased.

FIG. 7 is a schematic view showing a roof made on the basis of the above roofing material integrated solar battery module arranging method. In shift-roofing, the roofing material integrated solar battery modules are preferably alternately shifted to the left and right sides. In the arrangement result shown in FIG. 7, there is at least one portion where the roofing material integrated solar battery modules are not alternately shifted to the left and right sides by shift-roofing. For example, the fifth line should be shifted to the left side in accordance with the order of shift to the right and left sides in the first to fourth lines. However, since all of the roofing material integrated solar battery modules 103 are arranged to be symmetrical with respect to the central line 107 of the roof setting surface 101, this small irregularity in shift does not degrade the outer appearance of the roof.

[Frame Mounted Solar Battery Module]

Figure 8:
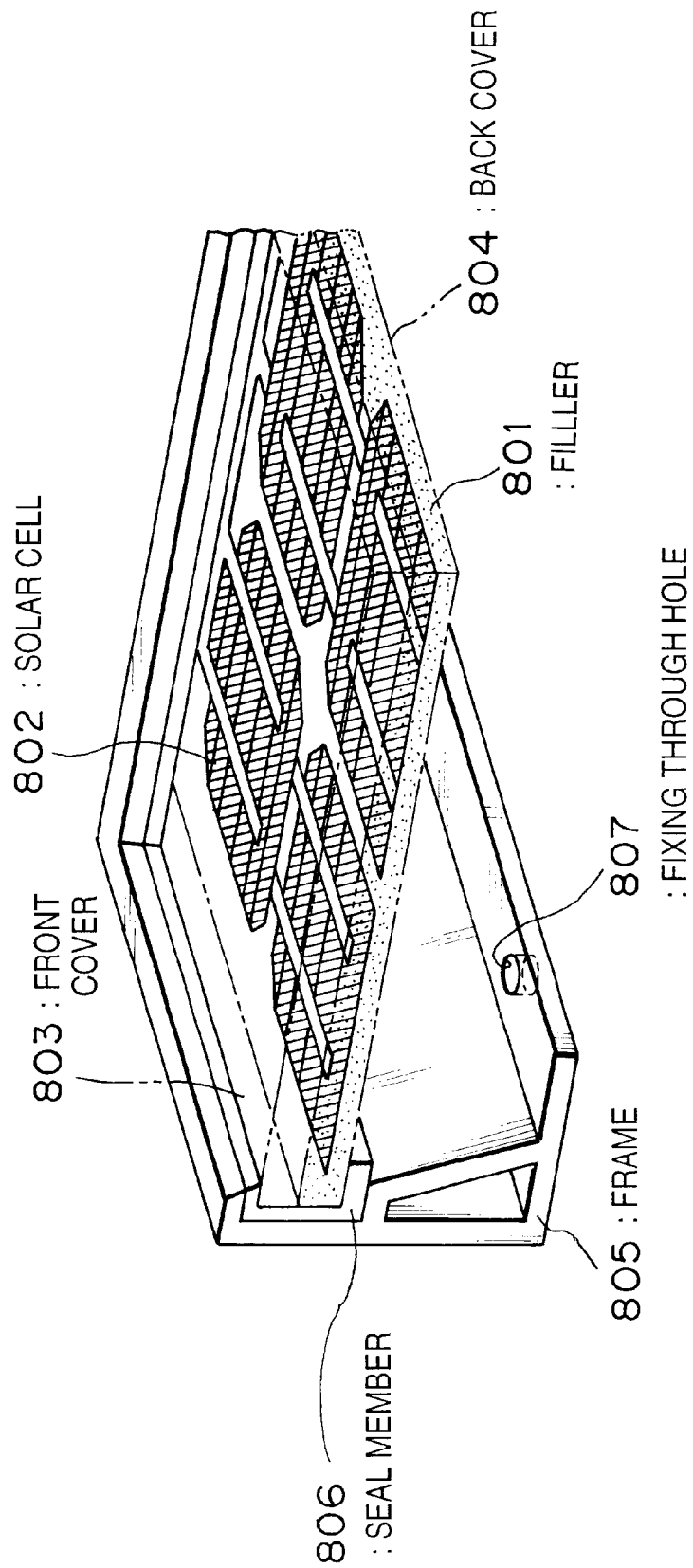
FIG. 8 is a perspective view showing the arrangement of a frame mounted solar battery module.

A frame mounted solar battery module can be formed from any one of single-crystal silicon, polysilicon, microcrystalline silicon, and amorphous silicon solar batteries. FIG. 8 shows an example of a frame mounted solar battery module. A solar cell 802 in which a filler 801 for imparting a weathering resistance is encapsulated is sandwiched by a front cover 803 as a light-receiving surface and a back cover 804 on the lower surface. At the peripheral portion, a seal member 806 is used for the attachment portion to a frame 805 to improve the sealing properties, and an attachment through hole 807 is formed in the long frame on the lower surface of the module to set the module on the trestle.

[Building Material Integrated Solar Battery Module]

Figure 9A:
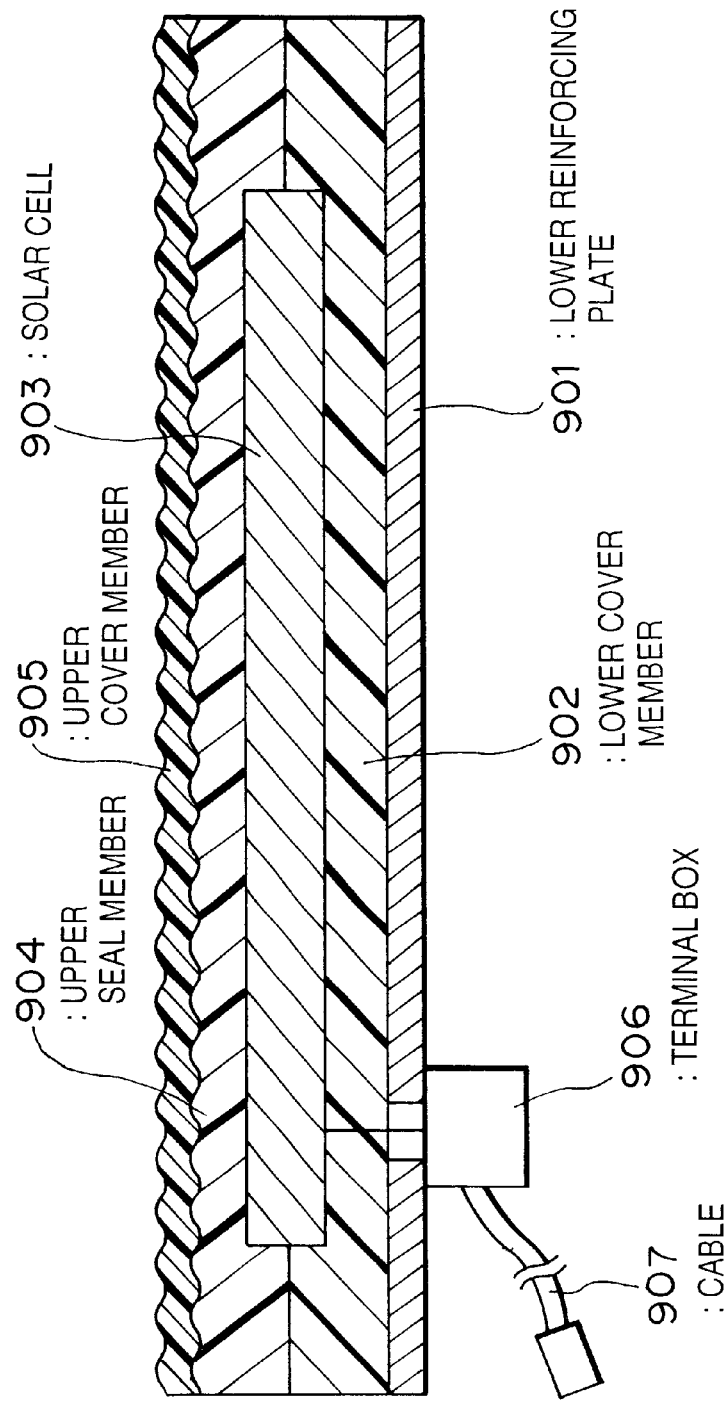

A building material solar battery module is a module integrated with a general building material such as a roofing material or wall material for the purpose of improvement of execution efficiency such that the solar battery modules can be set on a construction by the conventional method. FIGS. 9A and 9B show an example of a roofing material integrated solar battery module.

FIG. 9A is a sectional view showing the arrangement of a solar battery module which has, on a lower reinforcing plate 901, a lower cover member 902, a solar cell 903, an upper seal member 904, and an upper cover member 905.

The solar cell 903 can be manufactured from any one of single-crystal silicon, polysilicon, microcrystalline silicon, and amorphous silicon. Amorphous silicon having bendability and flexibility is preferable.

The lower reinforcing plate requires a weathering resistance, rigidity, and flexibility and is formed from a stainless steel sheet, a plated steel sheet, or a galvarium steel sheet. As the lower cover member 902 requiring insulating properties and durability, nylon, polyvinyl fluoride (PFV, Tedlar (trademark of Dupont)), or polyethylene terephthalate (PET) is used together with an adhesive.

The upper seal member 904 requires a weathering resistance, adhesion, filling properties, heat resistance, low-temperature resistance, and impact resistance, and is formed from an ethylene-vinyl acetate copolymer (EVA), an ethylene-ethyl acrylate copolymer (EEA), a polyolefin-based resin, an urethane resin, silicone resin, or a fluoroplastic. Of these materials, EVA is popularly used because of its balanced physical properties for the application purpose as a solar battery.

The upper cover member 905 requires performance such as a weathering resistance, stain resistance, and mechanical strength to ensure long-term reliability of the solar battery module which is exposed to the outdoor environment. As the upper cover member 905, a polyvinylidene fluoride resin, a polyvinyl fluoride resin, or an ethylene tetrafluoride-ethylene copolymer (ETFE) is preferably used.

A terminal box 906 and a cable 907 having a connector at the distal end are provided on the lower surface of the lower reinforcing plate 901 to output power from the solar cell 903.

Such a solar battery module is appropriately bent and used as a roofing material integrated solar battery module. FIG. 9B is a view showing an example in which solar battery modules are fabricated into a stepping roofing material and placed on the roof setting surface. A roofing material integrated solar battery module 900 is bent on two opposing sides, and an eaves-side engaging portion 910 and a ridge-side engaging portion 911 are formed at the bent portions. The ridge-side engaging portion 911 is fixed on a roof setting surface 913 such as a sheathing roof board by, e.g., a clip 912. Connection in the horizontal (line) direction is done by a joint 914 and a joint cover 915. Connection in the vertical direction is made by seaming the eaves-side engaging portion 910 and the ridge-side engaging portion 911 to each other. For the solar power generation roof of the present invention, a general roofing material 916 can be used in combination with the roofing material integrated solar battery module 900.

As shown in FIG. 26, a plurality of solar battery modules are connected in series to form a solar battery string. A plurality of solar battery strings are connected in parallel to form a solar battery array 1. The solar battery array 1 constitutes a solar power generation apparatus together with an inverter 2 as a power conversion unit for converting DC power into AC power. The number of solar battery strings connected in series is normally set such that the output voltage is close to the input voltage (e.g., 200 V) to the inverter. The solar power generation apparatus forms a so-called connection tie to supply power to a load in a building and simultaneously supply excess power to a commercial power line 5.

[Roof Setting Surface]

In FIG. 7, the roof setting surface 101 mainly means a roof surface. However, the roof setting surface is not limited to this. There are a variety of types of house roofs such as a gable or hip roof. The present invention is most preferably applied to a roof symmetry in the horizontal direction. In use of roofing material integrated solar battery modules, general roofing materials can be set on the roof setting surface 101 having no roofing material integrated solar battery modules 103.

[Allowable Setting Range]

To set solar battery modules on a roof setting surface, the following conditions are preferably satisfied.

For a frame mounted solar battery module:
(1) The roof has a strength capable of withstanding loads (including the weight of solar battery modules, snow, and wind pressure) which are expected in setting solar battery modules.
(2) The coefficient of wind force is larger at the edge of eaves, verge, and ridge than at the central portion of the roof. For this reason, no solar battery modules are set at the edge of eaves, verge, and ridge in consideration of wind pressure and on the basis of Notification No. 109 of the Ministry of Construction, "Reference of roofing materials, sheathing materials, and walls facing outside".

For a roofing material integrated solar battery module:

A roofing material integrated solar battery module can be arranged by the same method as that for the conventional roof materials except that it cannot be cut. Therefore, when roofing material integrated solar battery modules are to be set, verge, hip valley, and edge cover for a ridge need be taken into consideration.

On the basis of the above conditions, the frame mounted or roofing material integrated solar battery modules cannot be set on the entire roof setting surface, and there is the allowable setting range (indicated by a dotted line) 102, as shown in FIG. 7.

[Shift Width]

When roofing materials are to be arranged on a roof setting surface, the joint portions of roofing materials are set not to form lines in the vertical direction for weathering. The upper and lower roofing materials are shifted in the horizontal direction. This is called a shift, and the width of shift is called a shift width. In the present invention, however, a shift in the horizontal (line) direction of not only roofing materials but also solar battery modules of adjacent lines is called a shift, and the width of shift is called a shift width. The shift width is preferably equal to or smaller than ½ the length of the rectangular solar battery module in the longitudinal direction.

[Setting Surface Central Line]

The central line 107 of the roof setting surface 101 means a line passing through the center of common length of the upper and lower-side module lines of a line in the allowable setting range 102. In a trapezoidal roof surface symmetrical in the horizontal direction, as shown in FIG. 7, the central line is a straight line connecting the central point of the eaves 106 and the central point of the eaves 104. A solar battery module group is arranged while aligning the center of the solar battery module group on the central line 107. However, in actual execution, it is impossible to accurately align the center of the solar battery module group to the central line 107, and an error of several to several ten millimeters occurs. Even when the solar battery module group is arranged at the center, an error of about 1% of the length of the solar battery module may occur, and this does not degrade the outer appearance of the roof.

In the following description, "series connection of different numbers of modules" means that a solar battery module array is formed by combining two or more different numbers of series-connected solar battery modules.

[First Embodiment]

Figure 20:
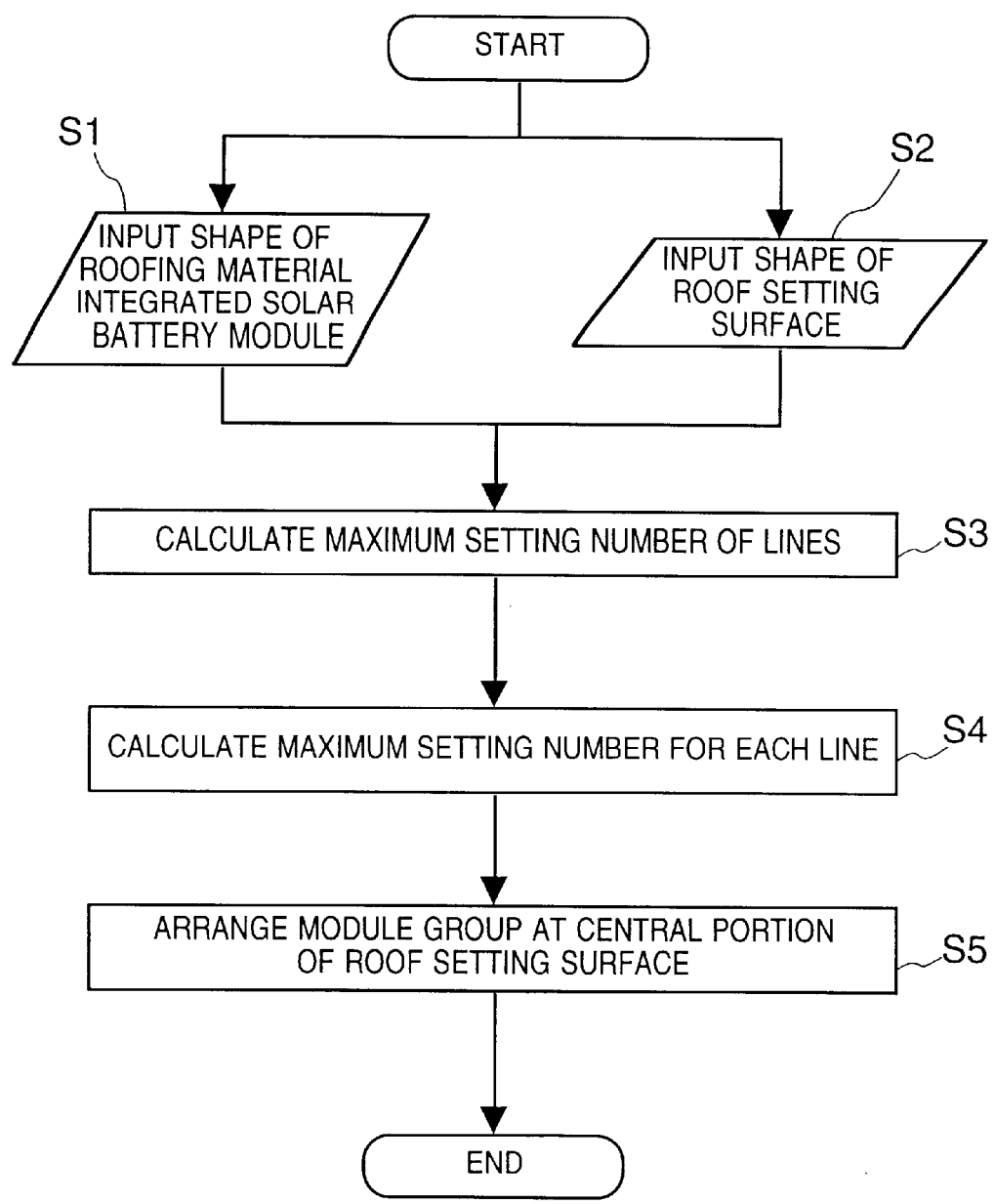
FIG. 20 is a flow chart showing the procedure of arranging solar battery modules in the first and fourth embodiments.

FIG. 1 is a view showing a state wherein roofing material integrated solar battery modules SR-02 (cover width W=200 mm, and length $\lambda$=2,000 mm) for a stepping roof, available from CANON INC. are arranged in an allowable setting range 102 on a trapezoidal roof whose eaves 104 have a length L1 of 12,000 mm, ridge 106 has a length L2 of 5,000 mm, and roof inclination has a length A1 of 4,500 mm in accordance with the procedure shown in the flow chart of FIG. 20 while setting a gap g1 from the eaves 104 to the allowable setting range 102 to be 0 mm, a gap g2 from the ridge 106 to the allowable setting range 102 to be 200 mm, and a gap g3 from a roof boundary 105 to the allowable setting range 102 to be 200 mm. The setting procedure will be briefly described below. The same numbers as in FIG. 19 denote the same steps in the flow chart of FIG. 20, and a detailed description thereof will be omitted.

[Calculation of Maximum Setting Number of Lines (Steps S1 to S3)]

In this embodiment, roofing material integrated solar battery modules 103 are arranged such that the longitudinal direction of a module is perpendicular to the roof inclination direction. A length A of the allowable setting range 102 in the inclination direction is given by:

$$A = A1 - g1 = 4,500 - 200 = 4,300 \text{ mm}$$

The number C of lines is given by:

$$C \leq A/W$$

When the values A and W are substituted into the above inequality, a maximum setting number Cmax is 21.

$$C \leq 4,300/200=21.5$$

[Calculation of Maximum Setting Number for Each Line (Step S4)]

For example, the number N of solar battery modules for each of the first to 11th lines counted from the eaves 104 is calculated. Letting B be the common length of the upper- and lower-side module lines of a line c in the allowable setting range 102, a maximum setting number Nmax is given by the maximum integer satisfying the following inequality:

$$N \leq B/\lambda$$

As is apparent from FIG. 1, B is the length of the upper-side module line. The lengths of the upper-side module lines of the first and 11th lines are 11,288 mm and 8,178 mm, respectively. The maximum setting number Nmax(1) for the first line is 5, and Nmax(11) for the 11th line is 4.

$$N(1) \leq 11,288/2,000=5.6$$

$$N(11) \leq 8,178/2,000=4.1$$

[Arrangement at Central Portion of Setting Surface (Step S5)]

Roofing material integrated solar battery modules 103 which have the maximum setting number and are calculated above for the respective lines are arranged at the central portion of a roof setting surface 101. When the maximum setting number Nmax is an even number, the intermediate portion of two roofing material integrated solar battery modules 103 is aligned to a central line 107. When the maximum setting number Nmax is an odd number, the center of the roofing material integrated solar battery modules 103 is aligned to the central line 107.

In this embodiment, the maximum setting number on the entire roof setting surface 101 is 74, and the roof occupation ratio representing the ratio of the roofing material integrated solar battery modules 103 to the roof area is 77.4%. According to this embodiment, roofing material integrated solar battery modules 103 having the maximum setting number are arranged on the roof setting surface 101. This is an efficient arranging method from the viewpoint of the roof occupation ratio. As is apparent from FIG. 1, the solar battery module group is arranged at the central portion of the roof setting surface 101 to be almost symmetrical with respect to the central line 107, so no problem of outer appearance of the roof is posed.

[Second Embodiment]

Figure 21:
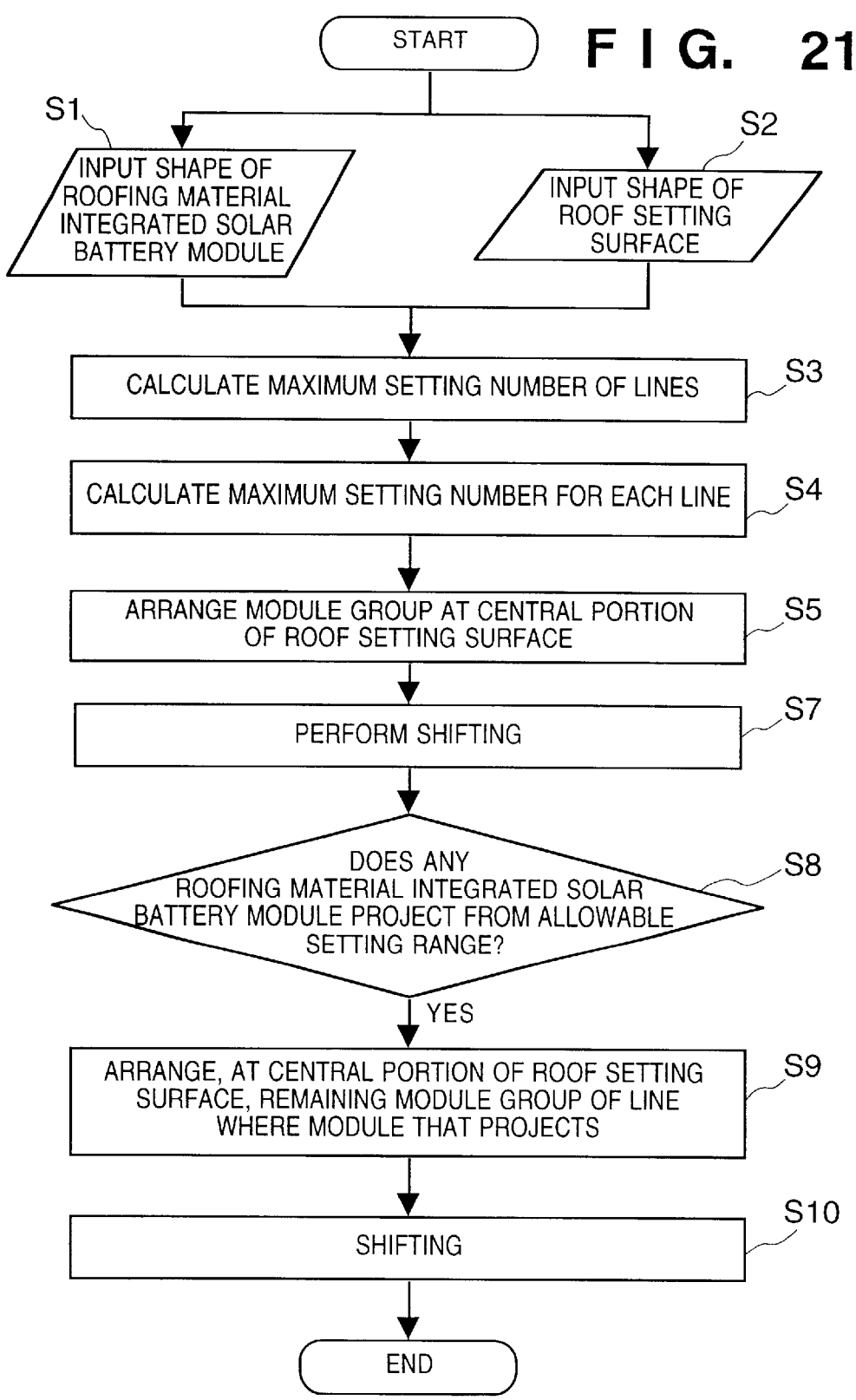
FIG. 21 is a flow chart showing the procedure of arranging solar battery modules in the second embodiment.

FIG. 7 is a view showing a state wherein the above-described roofing material integrated solar battery modules SR-02 are arranged in an allowable setting range 102 on a roof setting surface 101, which is the same as in FIG. 1, in accordance with the procedure shown in the flow chart of FIG. 21 while setting a shift width 609 to be 200 mm. The setting procedure will be briefly described below. The same numbers as in FIG. 19 denote the same steps in the flow chart of FIG. 21, and a detailed description thereof will be omitted. Calculation of a maximum setting number Cmax (steps S1 to S3), calculation of a maximum setting number Nmax for each line (step S4), and arrangement at the central portion of the setting surface (step S5) are the same operations as in the first embodiment, and a detailed description thereof will be omitted.

[Shifting (Step S7)]

Since the shift width 609 is 200 mm, the module groups are alternately shifted to the left and right sides by 100 mm in units of lines.

[Determination (Step S8)]

When the module groups are shifted, the 11th and 17th lines are out of the allowable setting range 102 (FIG. 6). The reason for this is as follows. In, e.g., the 11th line, when the module group is arranged at the central portion of the roof setting surface 101, the distance from the end module to the boundary line of the allowable setting range 102 is (8,178−4×2,000)/2=89 mm, and the shift distance is smaller than 100 mm.

[Rearrangement (Step S9)]

By shifting in step S7, the number of roofing material integrated solar battery modules 103 changes from 4 to 3 in the 11th line, and the number of roofing material integrated solar battery modules 103 changes from 3 to 2 in the 17th line. Therefore, the three module groups in the 11th line are rearranged at the center and shifted in the direction opposite to the shift direction for the 12th line, i.e., to the left side by 100 mm. The two module groups in the 17th line are rearranged at the center and shifted in the direction opposite to the shift direction for the 18th line, i.e., to the right side by 100 mm.

In this embodiment, because of shifting, the roofing material integrated solar battery modules 103 do not fall within the allowable setting range 102. As is apparent from FIG. 7, the number of modules decreases from 4 to 3 for the 11th line counted from the eaves 104, and from 3 to 2 for the 17th line. In this case, the maximum setting number on the entire roof setting surface 101 is 72, and the roof occupation ratio is 75.3%. That is, even when roofing with the shift 609 is done, the number of roofing material integrated solar battery modules becomes smaller than that in the first embodiment by only two, and the roof occupation ratio is still as high as 75.3%. Since the modules are shifted to the left and right sides with respect to a central line 107 of the roof setting surface 101 by the shift width 609, the weathering function is maintained while keeping good outer appearance of the roof.

[Comparative Example 1]

Figure 2:
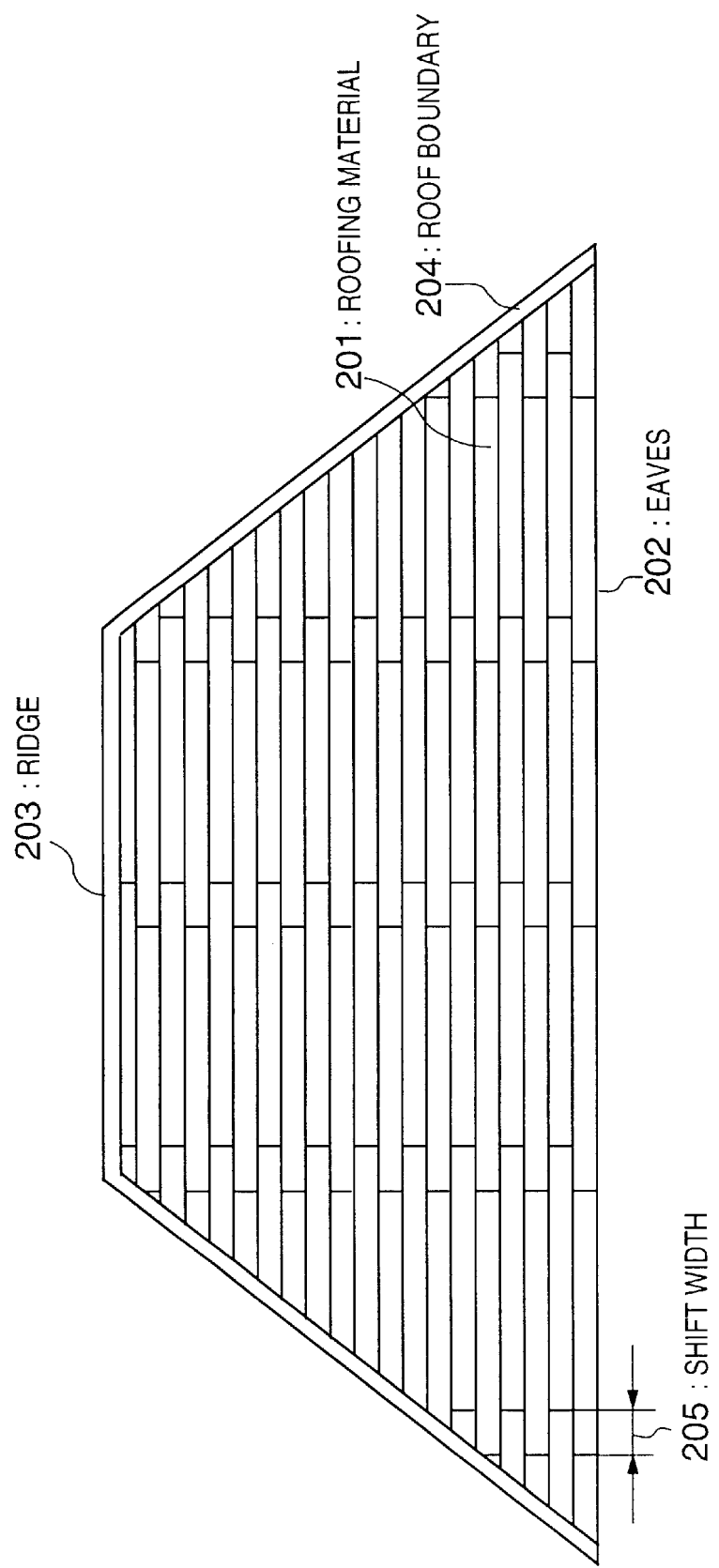
FIG. 2 is a view for explaining the shift-roofing method.
Figure 10:
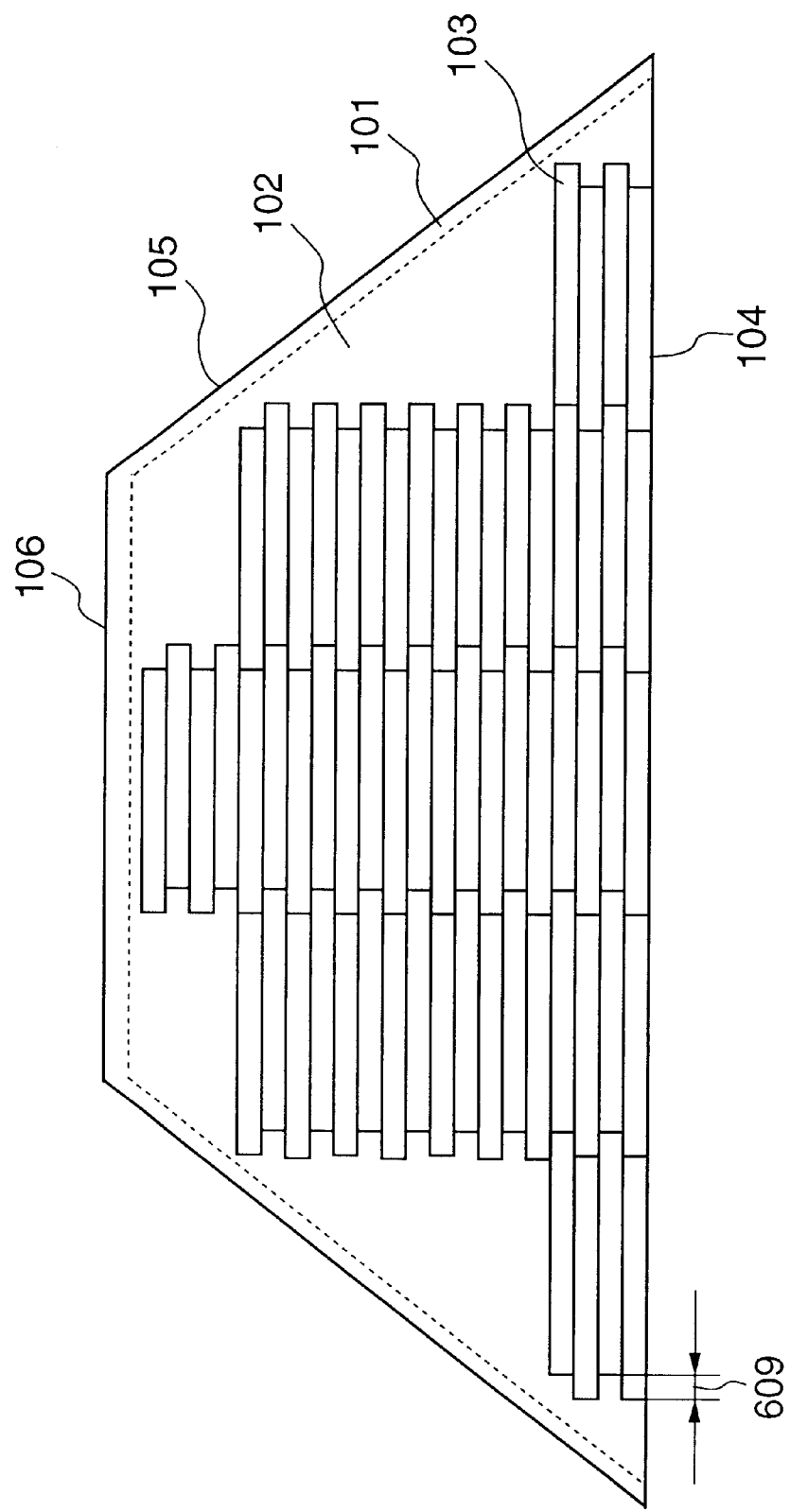
FIG. 10 is a view showing the solar battery module arranged state of Comparative Example 1.

FIG. 10 is a view showing an example in which the above-described roofing material integrated solar battery modules SR-02 are arranged to be symmetrical in the horizontal direction in the allowable setting range 102 on the roof setting surface 101, which is the same as in FIG. 1, by the conventional shift-roofing method (FIG. 2) while setting the shift width 609 to be 200 mm. In this example, the maximum setting number is 59, and the roof occupation ratio is 61.7%.

[Comparative Example 2]

Figure 3:
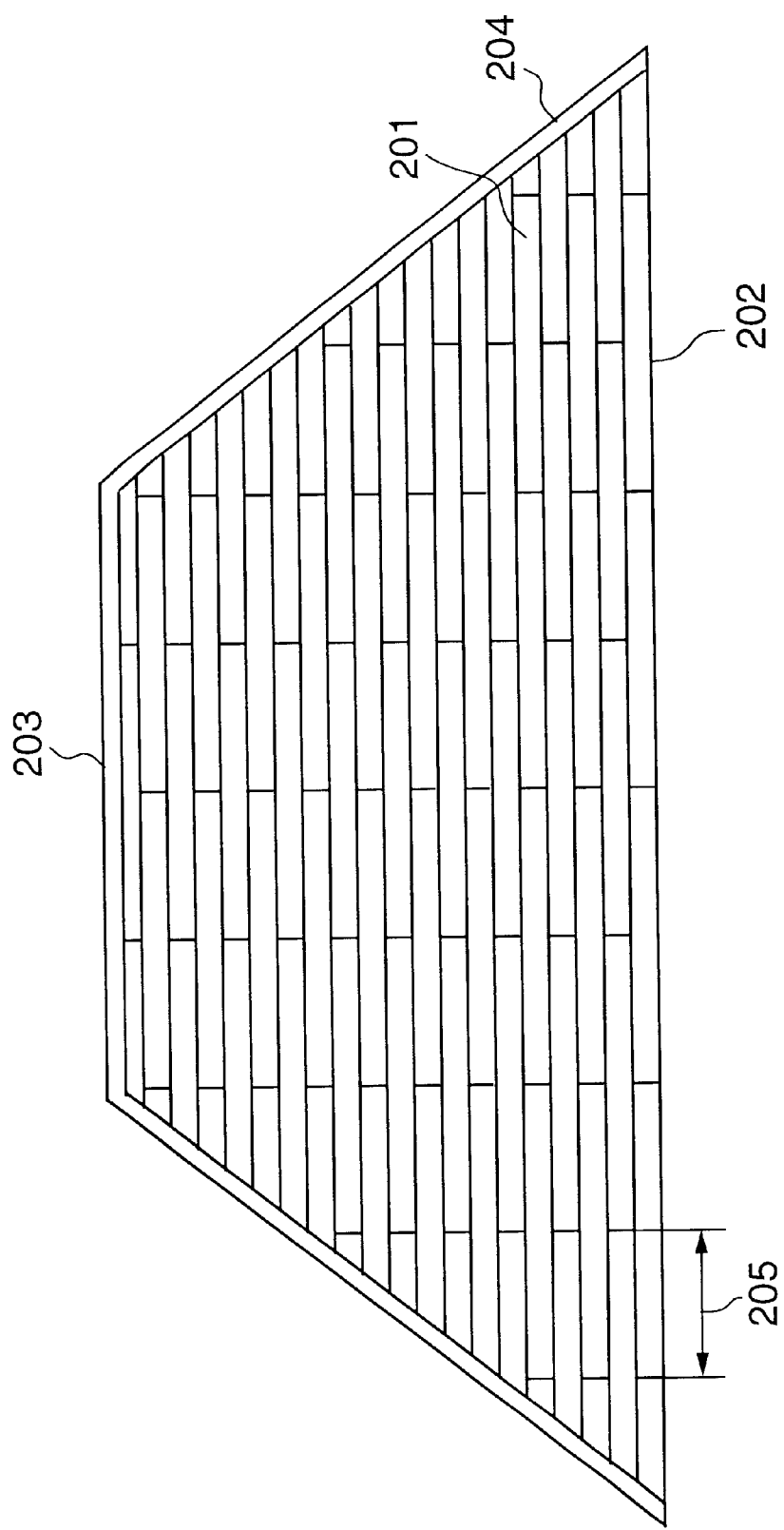
FIG. 3 is a view for explaining the dutch-lap method.
Figure 4:
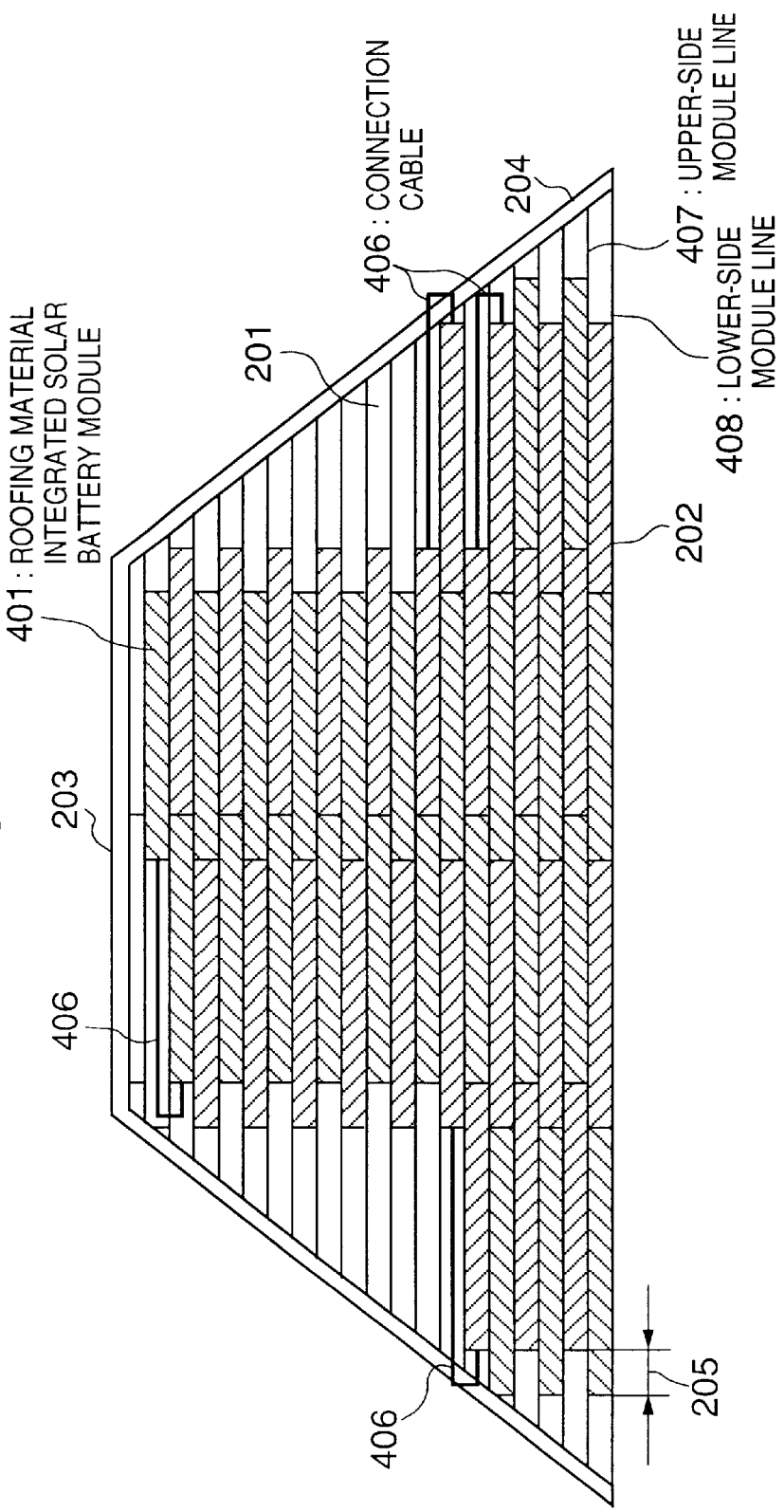
FIG. 4 is a view showing a state wherein solar battery modules and general roofing material integrated solar battery modules are simultaneously arranged by the shift-roofing method.
Figure 5:
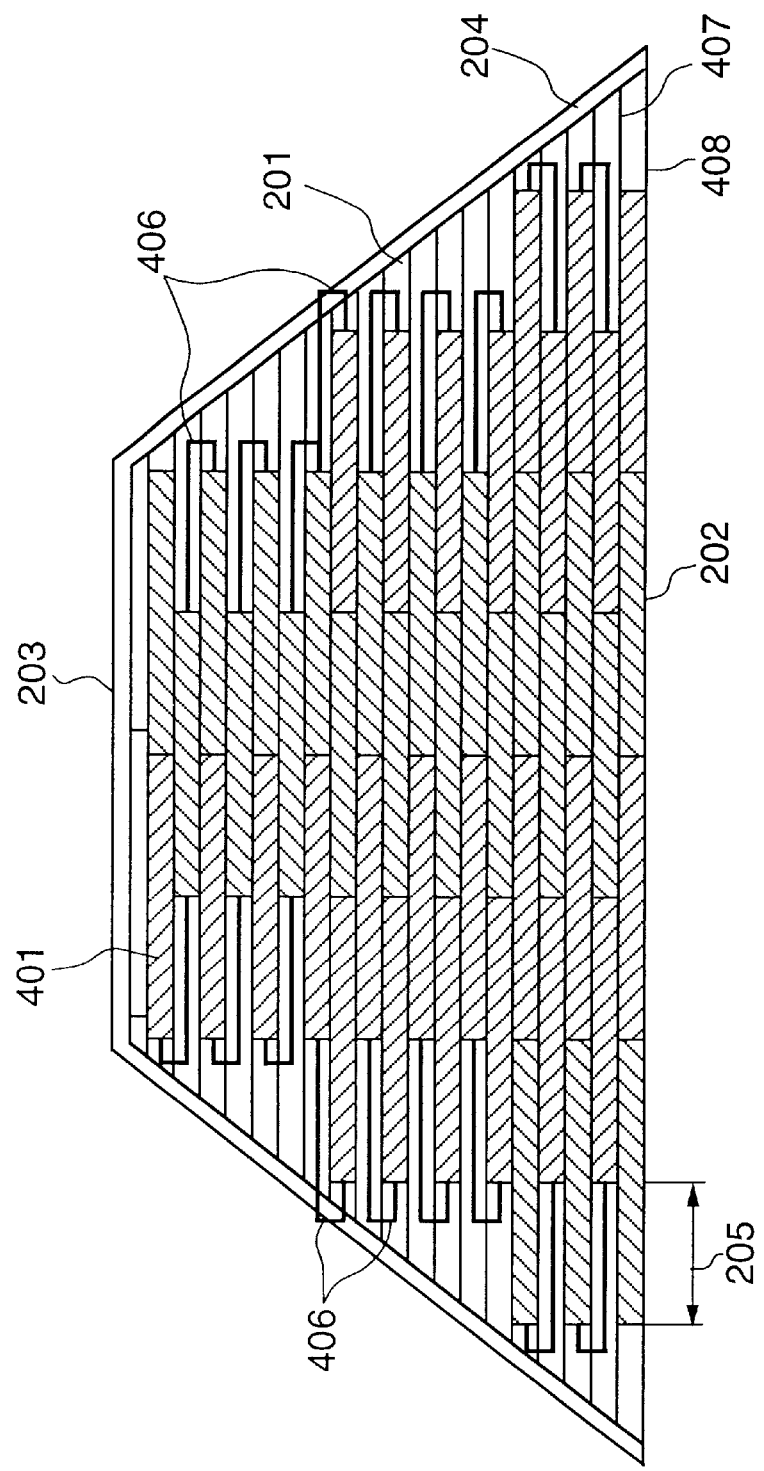
FIG. 5 is a view showing a state wherein solar battery modules and general roofing material integrated solar battery modules are simultaneously arranged by the dutch-lap method.
Figure 11:
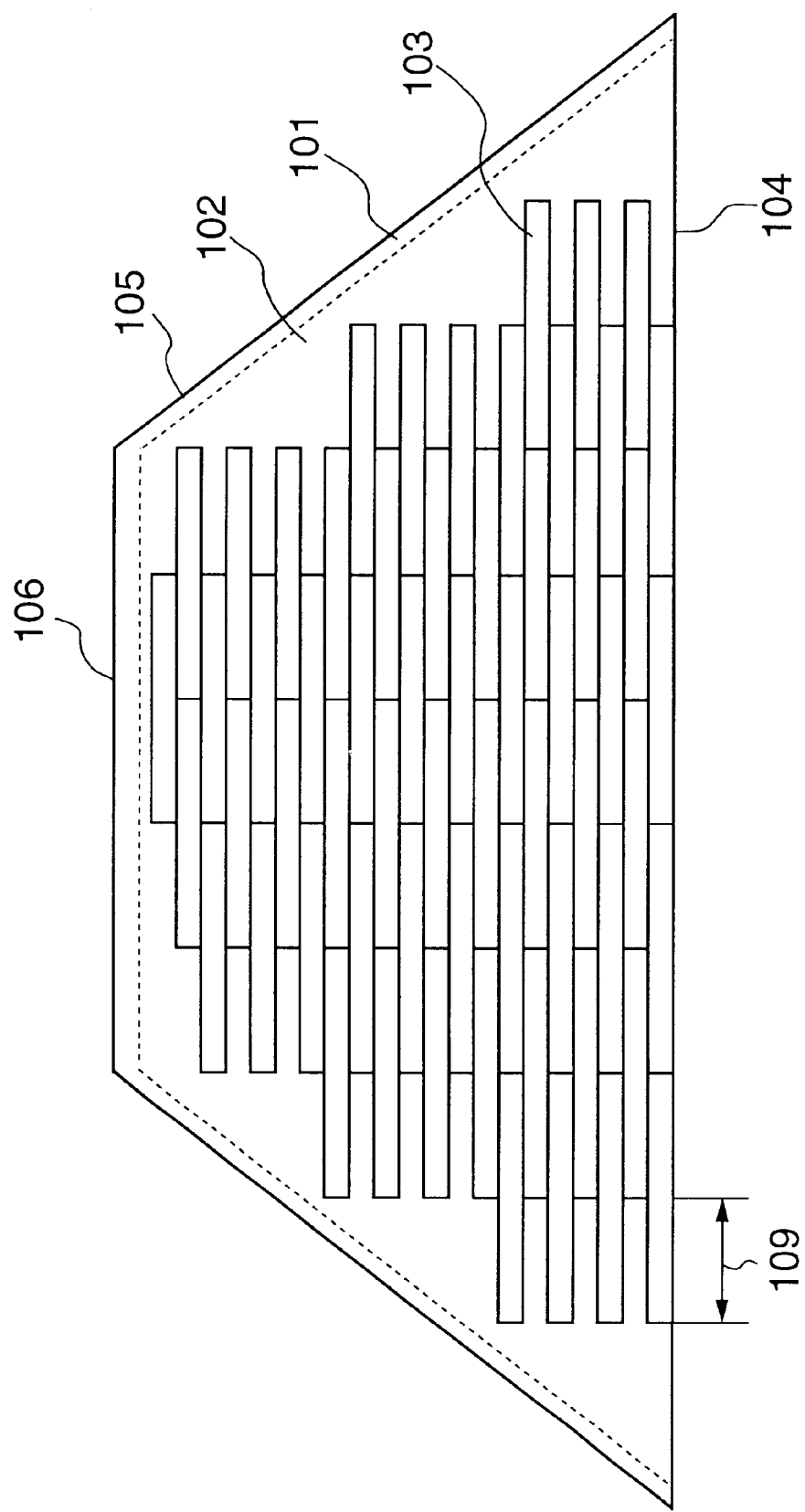
FIG. 11 is a view showing the solar battery module arranged state of Comparative Example 2.

FIG. 11 is a view showing an example in which the above-described roofing material integrated solar battery modules SR-02 are arranged in the allowable setting range 102 on the roof setting surface 101, which is the same as in FIG. 1, by the conventional dutch-lap method (FIG. 3). In this example, the maximum setting number is 62, and the roof occupation ratio is 64.8%.

[Third Embodiment]

Figure 12:
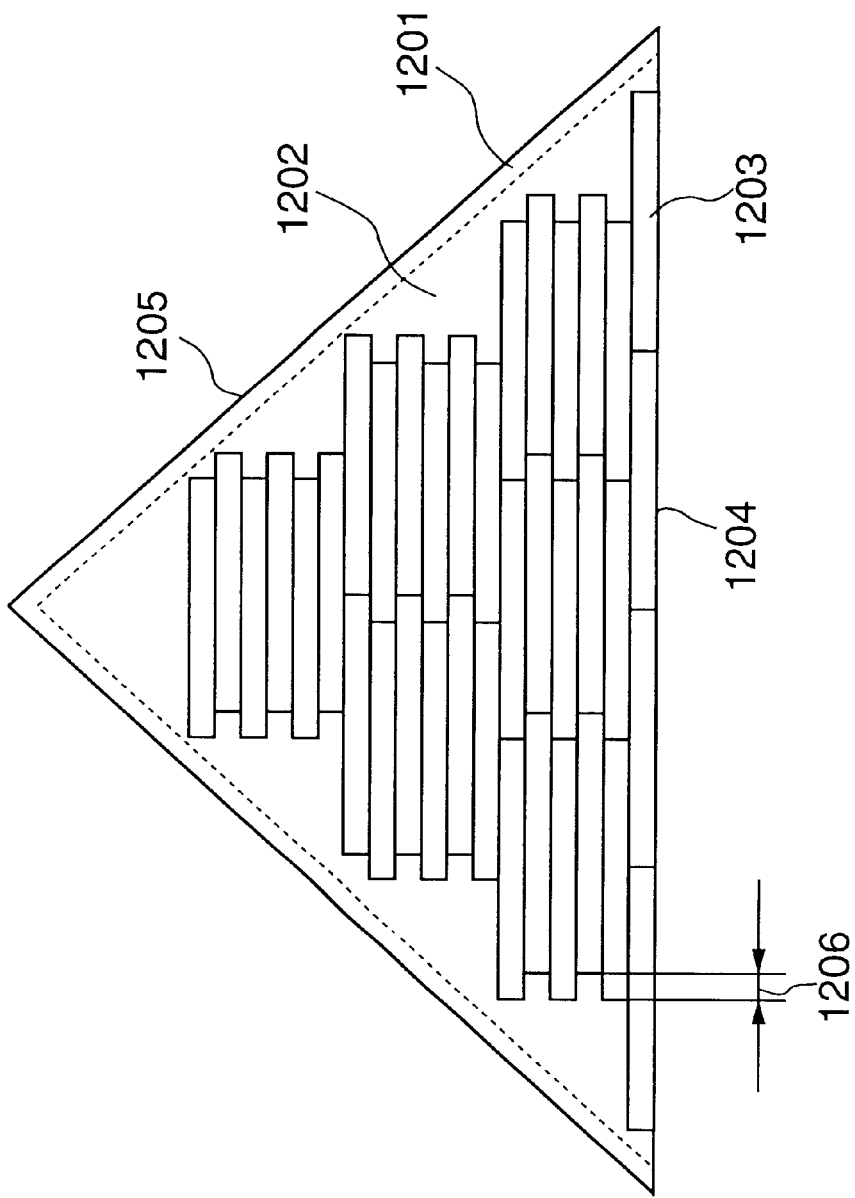
FIG. 12 is a view showing the solar battery module arranged state of the third embodiment.
Figure 22:
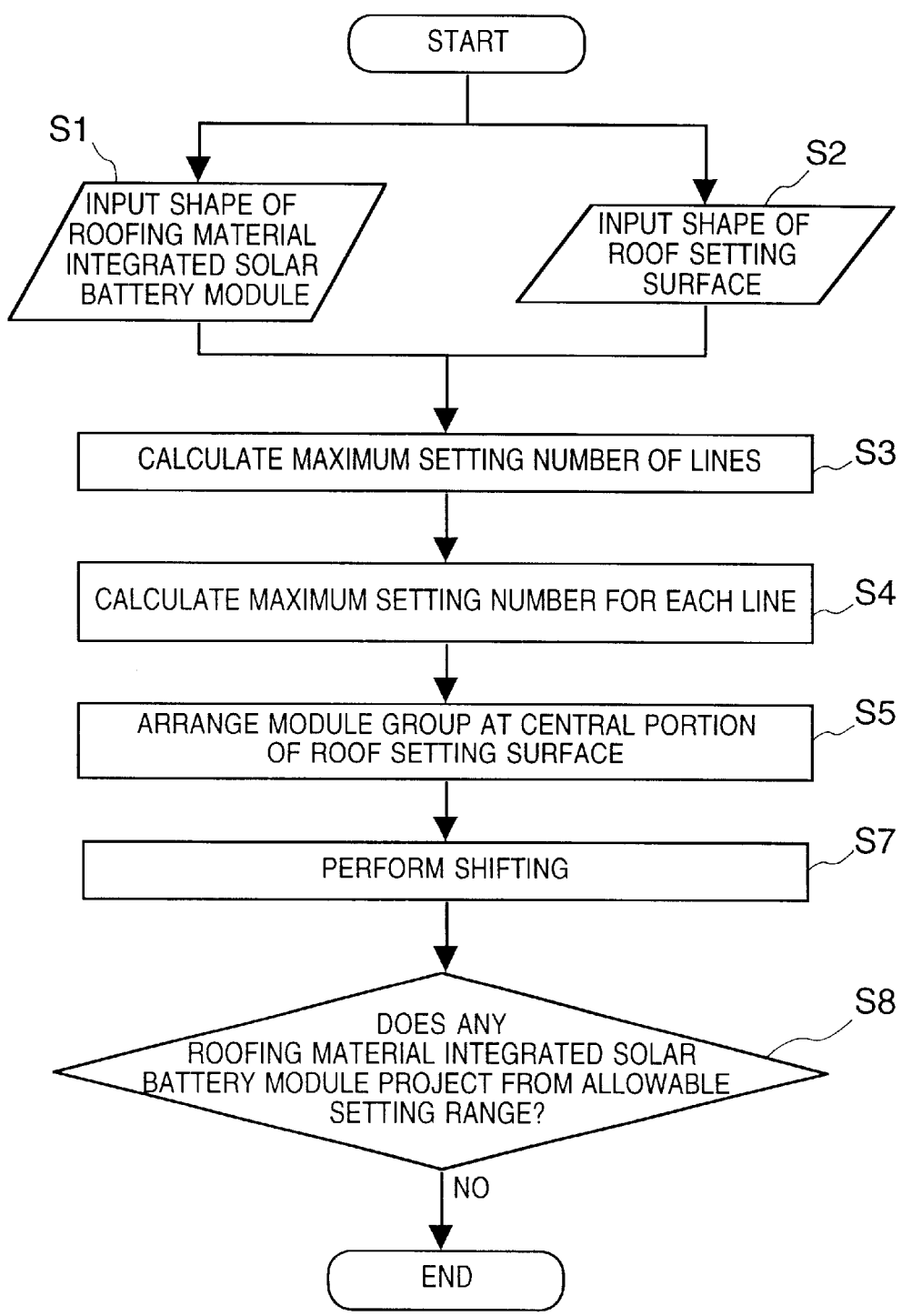
FIG. 22 is a flow chart showing the procedure of arranging solar battery modules in the third embodiment.

FIG. 12 is a view showing a state wherein the above-described roofing material integrated solar battery modules SR-02 are arranged in an allowable setting range 1202 on a triangular roof whose eaves 1204 have a length L1 of 9,200 mm and roof inclination has a length A1 of 5,050 mm in accordance with the procedure shown in the flow chart of FIG. 22 while setting a gap g1 from the eaves 1204 to the allowable setting range 1202 to be 0 mm, and a gap g3 from a roof boundary 1205 to the allowable setting range 1202 to be 200 mm. The setting procedure will be briefly described below. The same numbers as in FIG. 19 denote the same steps in the flow chart of FIG. 22, and a detailed description thereof will be omitted.

[Calculation of Maximum Setting Number of Lines (Steps S1 to S3)]

A length A of the allowable setting range 1202 in the inclination direction is given by:

$$A = A1 - g1 = 5,050 - 200 = 4,850 \text{ mm}$$

The number C of lines is given by the following inequality, and a maximum setting number Cmax of lines is 24:

$$C \leq 4,850/200 = 24.25$$

[Calculation of Maximum Setting Number for Each Line (Step S4)]

For example, the number N of solar battery modules for each of the first to 18th lines counted from the eaves 1204 is calculated. A maximum setting number Nmax is given by the maximum integer satisfying the following inequality:

$$N \leq B/\lambda$$

The lengths of the upper-side module lines of the first and 18th lines, which correspond to B, are 8,436 mm and 2,242 mm, respectively. The maximum setting number Nmax(1) for the first line is 4, and Nmax(18) for the 18th line is 1.

$$N(1) \leq 8,436/2,000 = 4.2$$

$$N(18) \leq 2,242/2,000 = 1.1$$

From the 19th line, the length of the upper-side module lines is smaller than 2,000 mm, so no roofing material integrated solar battery modules 1203 can be set.

[Arrangement at Central Portion of Setting Surface (Step S5)]

Roofing material integrated solar battery modules 1203 which have the maximum setting number and are calculated above for the respective lines are arranged at the central portion of a roof setting surface 1201. When the maximum setting number Nmax is an even number, the intermediate portion of two roofing material integrated solar battery modules 1203 is aligned to the central line of the roof setting surface 1201. When the maximum setting number Nmax is an odd number, the center of the roofing material integrated solar battery modules 1203 is aligned to the central line of the roof setting surface 1201.

[Shifting (Step S7)]

Since a shift width 1206 is 200 mm, the module groups are alternately shifted to the left and right sides by 100 mm in units of lines.

[Determination (Step S8)]

Since the distance from the end module to the boundary line of the allowable setting range 1202 is not smaller than 100 mm from the first to 18th lines, the roofing material integrated solar battery modules 1203 do not project from the allowable setting range 1202. In this embodiment, the maximum setting number is 37, and the roof occupation ratio is 63.7%.

[Comparative Example 3]

Figure 13:
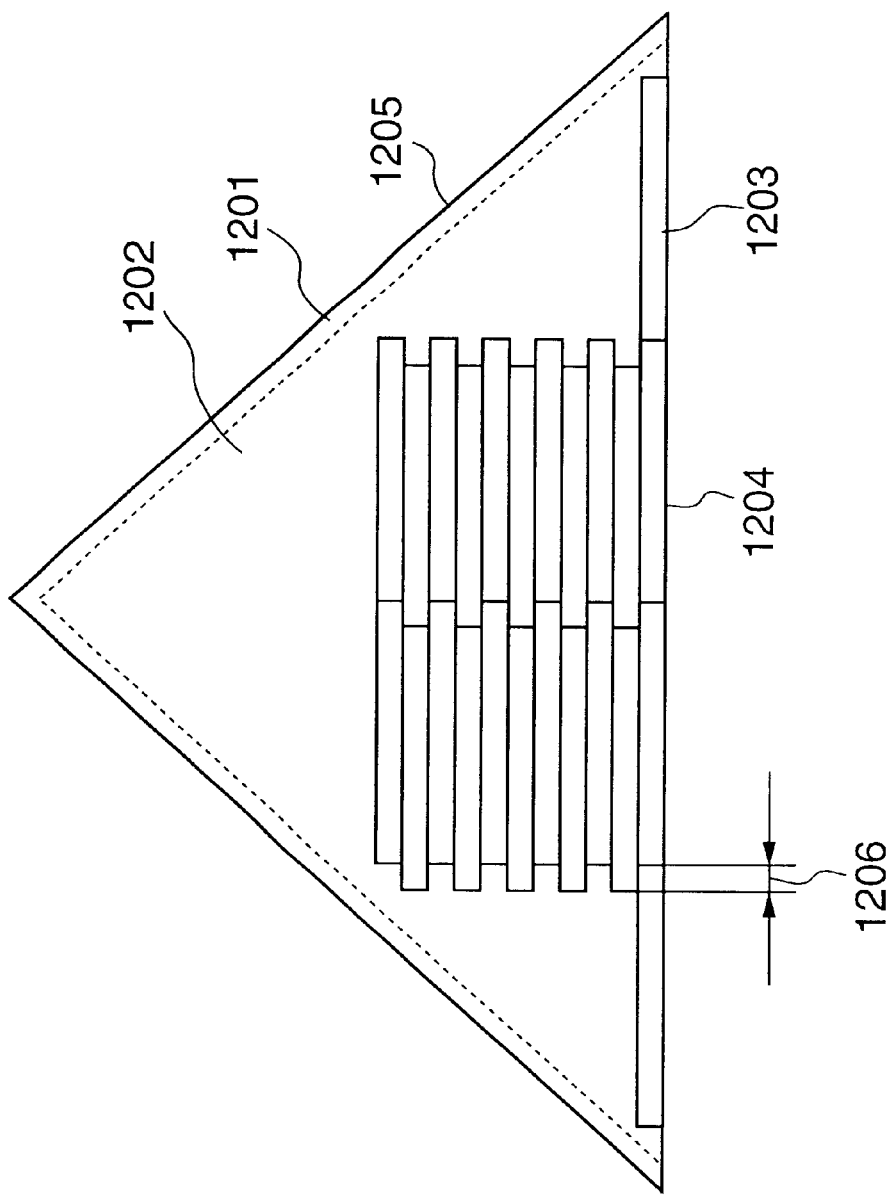
FIG. 13 is a view showing the solar battery module arranged state of Comparative Example 3.

FIG. 13 is a view showing an example in which the above-described roofing material integrated solar battery modules SR-02 are arranged to be symmetrical in the horizontal direction in the allowable setting range 1202 on the roof setting surface 1201, which is the same as in FIG. 12, by the conventional shift-roofing method while setting the shift width 1206 to be 200 mm. In this example, the maximum setting number is 24, and the roof occupation ratio is 41.3%.

[Comparative Example 4]

Figure 14:
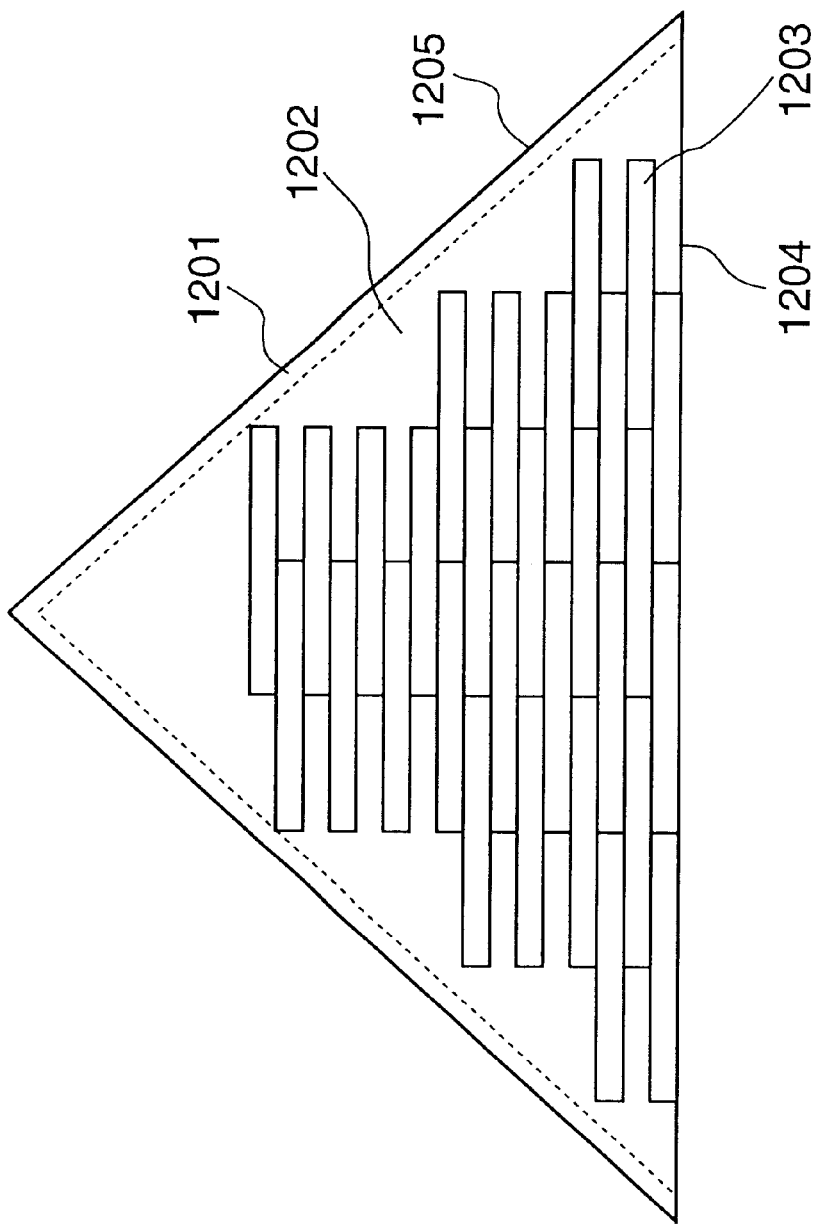
FIG. 14 is a view showing the solar battery module arranged state of Comparative Example 4.

FIG. 14 is a view showing an example in which the above-described roofing material integrated solar battery modules SR-02 are arranged in the allowable setting range 1202 on the roof setting surface 1201, which is the same as in FIG. 12, by the conventional dutch-lap method. In this example, the maximum setting number is 29, and the roof occupation ratio is 49.9%.

[Fourth Embodiment]

Figure 15:
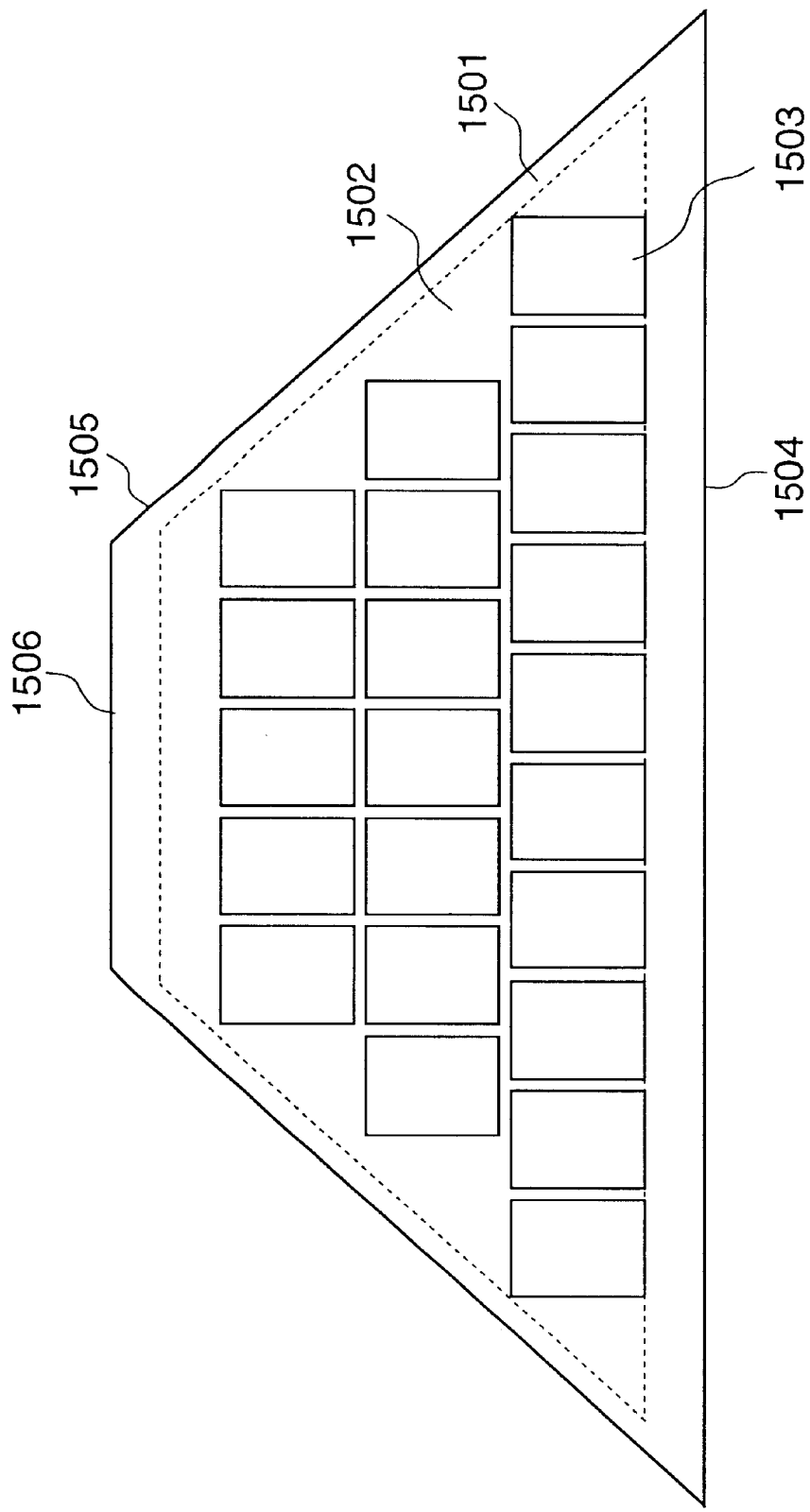
FIG. 15 is a view showing the solar battery module arranged state of the fourth embodiment.

FIG. 15 is a view showing a state wherein frame mounted solar battery modules (W=822 mm, and λ=1,220 mm) are arranged in an allowable setting range 1502 on a trapezoidal roof whose eaves 1504 have a length L1 of 12,000 mm, ridge 1506 has a length L2 of 3,640 mm, and roof inclination has a length A1 of 4,957 mm in accordance with the procedure shown in the flow chart of FIG. 20 while setting a gap g1 from the eaves 1504 to the allowable setting range 1502 to be 500 mm, a gap g2 from the ridge 1506 to the allowable setting range 1502 to be 500 mm, and a gap g3 from a roof boundary 1505 to the allowable setting range 1502 to be 300 mm. The setting procedure will be briefly described below.

[Calculation of Maximum Setting Number of Lines (Steps S1 to S3)]

A length A of the allowable setting range 1502 in the inclination direction is given by:

$$A = A1 - g1 - g2 = 4,957 - 500 - 500 = 3,957 \text{ mm}$$

The number C of lines is given by the following inequality, and a maximum setting number Cmax of lines is 3:

$$C \leq A1/W = 3,957/1,220 = 3.24$$

From this, the maximum setting number of lines is 3.

[Calculation of Maximum Setting Number for Each Line (Step S4)]

For example, the number N of solar battery modules for each of the first, second, and third lines counted from the eaves 1504 is calculated. A maximum setting number Nmax is given by the maximum integer satisfying the following inequality:

maximum setting number $N \leq B$ (length of upper-side module line)/λ (length of solar battery module)

The lengths of the upper-side module lines of the first, second, and third lines are 8,499 mm, 6,442 mm, and 4,384 mm, respectively. The maximum setting number Nmax(1) for the first line is 10, Nmax(2) for the second line is 7, and Nmax(3) for the third line is 5.

$$N(1) \leq 8,499/822 = 10.33$$

$$N(2) \leq 6,442/822 = 7.83$$

$$N(3) \leq 4,384/822 = 5.33$$

[Arrangement at Central Portion of Setting Surface (Step S5)]

Frame mounted solar battery modules 1503 which have the maximum setting number and are calculated above for the respective lines are arranged at the central portion of a roof setting surface 1501. When the maximum setting number Nmax is an even number, the intermediate portion of two frame mounted solar battery modules 1503 is aligned to the central line of the roof setting surface 1501. When the maximum setting number Nmax is an odd number, the center of the frame mounted solar battery modules 1503 is aligned to the central line of the roof setting surface 1501. For the first line, the intermediate portion of two frame mounted solar battery modules is aligned to the central line of the roof setting surface 1501. For the second and third lines, the center of the frame mounted solar battery modules is aligned to the central line of the roof setting surface 1501. In this embodiment, the maximum setting number is 22, and the roof occupation ratio is 56.9%.

[Comparative Example 5]

Figure 16:
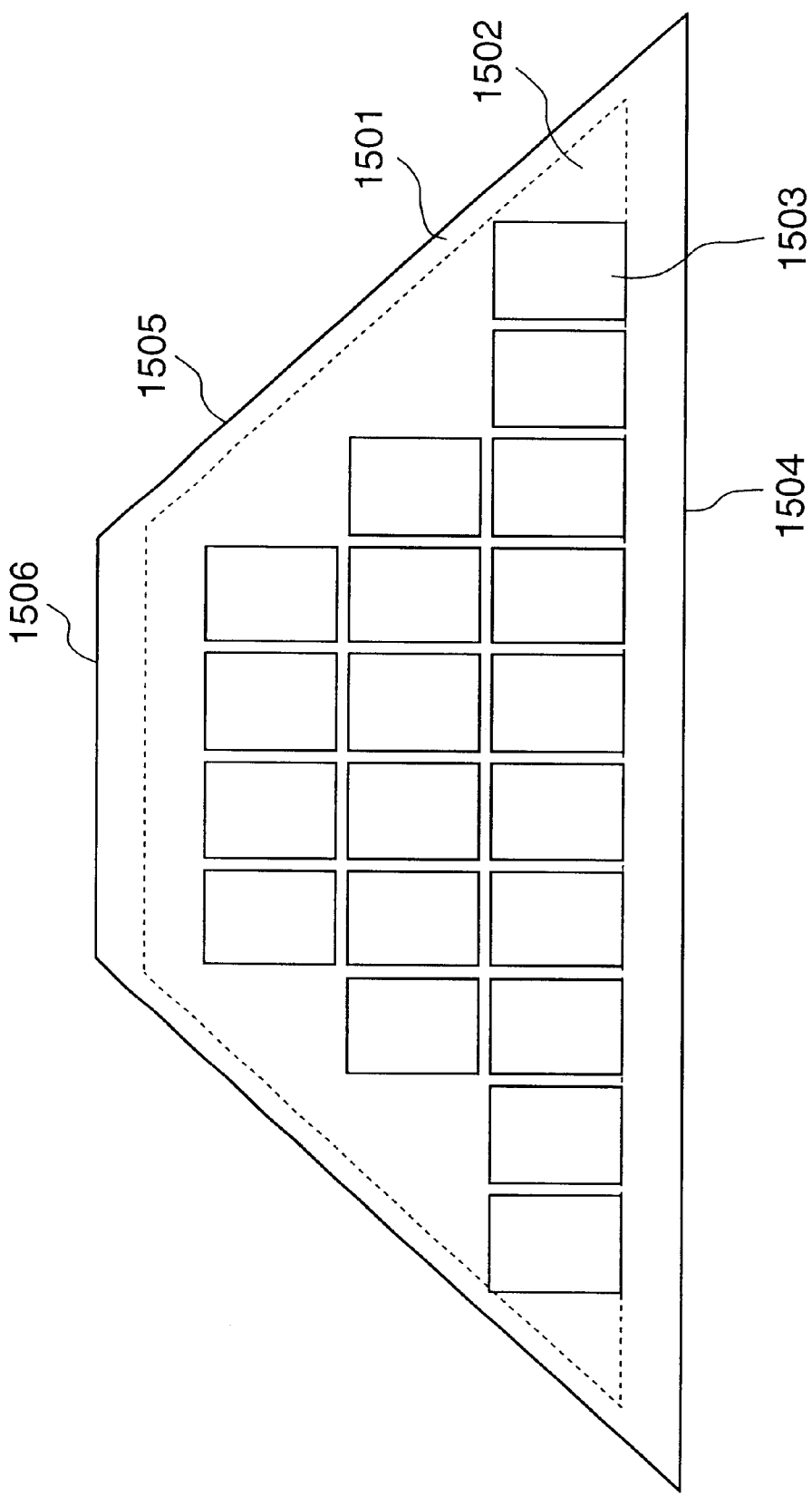
FIG. 16 is a view showing the solar battery module arranged state of Comparative Example 5.

FIG. 16 is a view showing an example in which the above 822 mm×1,220 mm frame mounted solar battery modules 1503 are arranged in the allowable setting range 1502 on the roof setting surface 1501, which is the same as in FIG. 15, by the conventional arranging method for arranging the modules with their ends aligned in the vertical direction. In this example, the maximum setting number is 20, and the roof occupation ratio is 51.7%.

[Evaluation]

FIG. 25 shows evaluation results of the maximum setting numbers and roof occupation ratios of the above-described first to fourth embodiments and comparative examples thereof. As is apparent from FIG. 25, the solar battery module arranging methods of the embodiments are more advantageous in the maximum setting number and roof occupation ratio than the comparative examples.

As in the fifth embodiment to be described later, even in a polygonal roof setting surface other than a rectangular roof, when the arranging method of the present invention is applied by dividing the roof setting surface into trapezoids and rectangles, the roof occupation ratio and outer appearance of the roof can be kept at high level.

[Fifth Embodiment]

Figure 17:
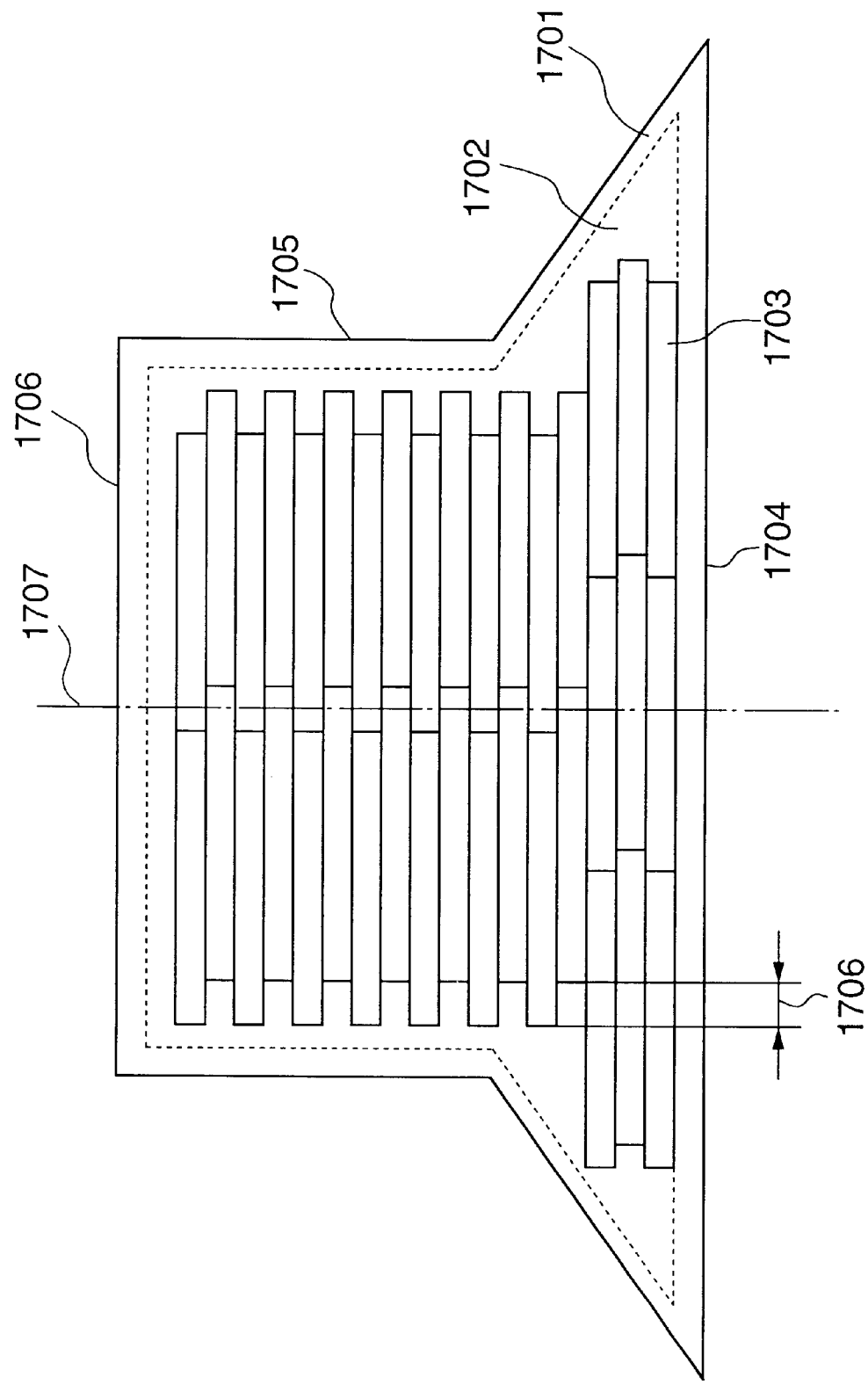
FIG. 17 is a view showing the solar battery module arranged state of the fifth embodiment.
Figure 23:
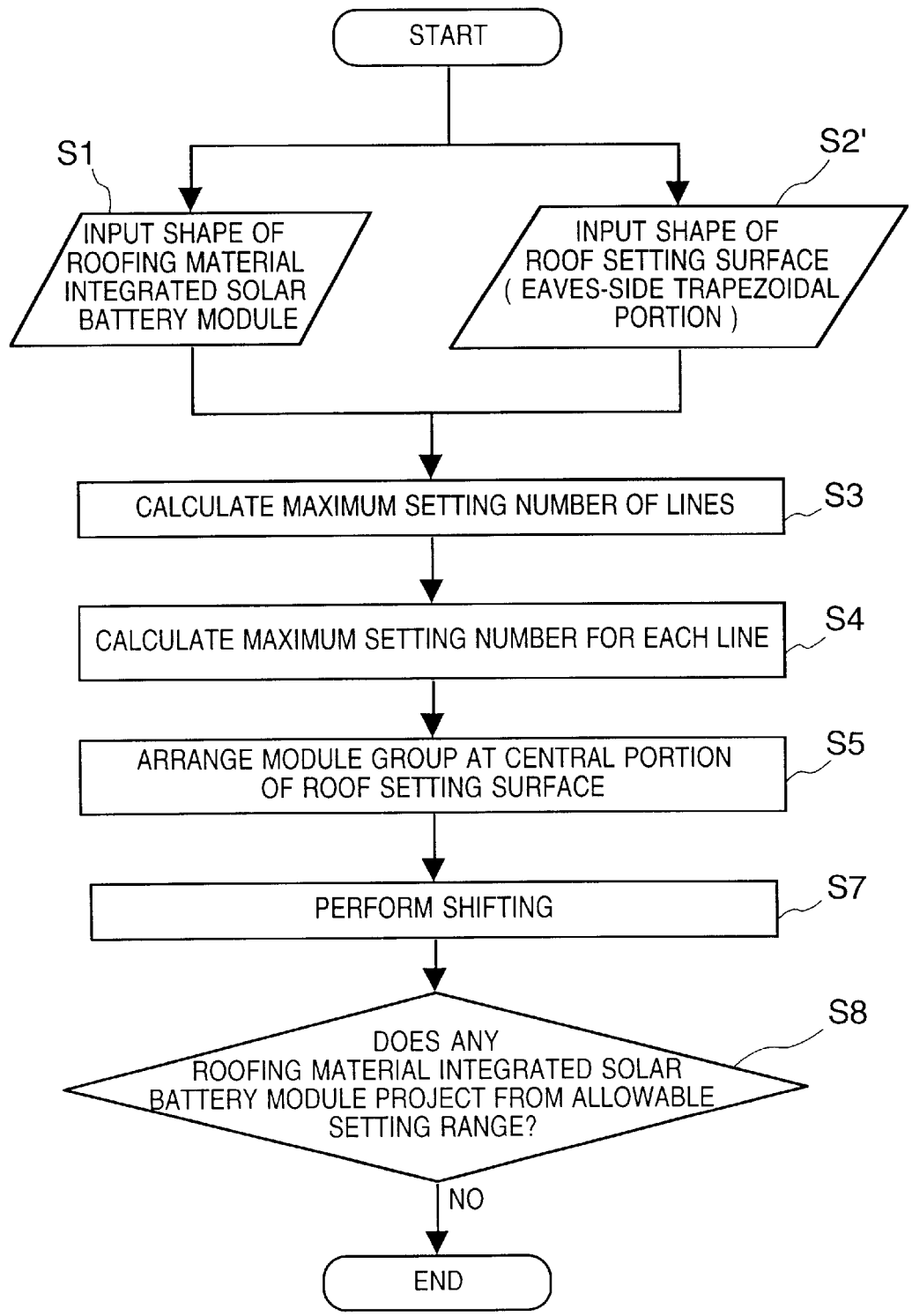
FIG. 23 is a flow chart showing the procedure of arranging solar battery modules in the fifth embodiment.

FIG. 17 is a view showing a state wherein the above-described roofing material integrated solar battery modules SR-02 are arranged on an Irimoya-type roof whose eaves 1704 has a length L1 of 9,000 mm, ridge 1706 has a length L2 of 5,000 mm, roof inclination direction of the trapezoidal portion has a length A1 of 1,390 mm, and roof inclination of the rectangular portion has a length A2 of 2,570 mm in accordance with the procedure shown in the flow chart of FIG. 23 while setting gaps g1 to g3 from the eaves 1704, ridge 1706, and roof boundary 1705 to the allowable setting range to be 200 mm. The same numbers as in FIG. 19 denote the same steps in the flow chart of FIG. 23, and a detailed description thereof will be omitted. The "Irimoya-type roof" means that the upper portion of one roof surface is formed into a gable, and roof surfaces are formed at the four lower sides of the lower portions.

[Calculation of Maximum Setting Number of Lines (Steps S1 to S3)]

A length A of an allowable setting range 1702 in the inclination direction is given by:

$A = A1 + A2 - g1 - g2 + 1,390 + 2,570 - 200 - 200 = 3,560$ mm

The number C of lines is given by the following inequality, and a maximum setting number Cmax of lines is 17:

$C \leq 3,560/200 = 17.8$

[Calculation of Maximum Setting Number for Each Line (Step S4)]

For example, the number N of solar battery modules for each of the first and seventh lines counted from the eaves 1704 is calculated. A maximum setting number Nmax is given by the maximum integer satisfying the following inequality:

$N \leq B/\lambda$

The lengths of the upper-side module lines of the first and seventh lines are 7,449 mm and 4,600 mm, respectively. The maximum setting number Nmax(1) for the first line is 3, and Nmax(7) for the seventh line is 2.

$N(1) \leq 7,449/2000 = 3.72$ $N(7) \leq 4,600/2000 = 2.3$

[Arrangement at Central Portion of Setting Surface (Step S5)]

Roof material integrated solar battery modules 1703 which have the maximum setting number and are calculated above for the respective lines are arranged at the central portion of a roof setting surface 1701.

[Shifting (Step S7)]

Since a shift width 1706 is 200 mm, the module groups are alternately shifted to the left and right sides by 100 mm in units of lines.

[Determination (Step S8)]

The minimum value of the distance from the end module to the boundary line of the allowable setting range 1702 is equal to or larger than 100 mm when the modules are arranged at the central portion of the setting surface (step S5). Therefore, the roofing material integrated solar battery modules 1703 do not project from the allowable setting range 1702 upon shifting.

In this embodiment, the maximum setting number is 37, and the roof occupation ratio is 65.5%. According to the arranging method of the present invention, the outer appearance does not degrade even in a roof having a complex shape such as the Irimoya-type roof shown in FIG. 17, and a lot of solar battery modules can be arranged.

[Sixth Embodiment]

In FIG. 24, frame mounted solar battery modules 2403 (1,100×822 mm) are arranged on a rhombic roof in accordance with the procedure shown in the flow chart of FIG. 20 while setting a gap g1 from eaves 2404 to an allowable setting range 2402 to be 0 mm, a gap g2 from a ridge 2406 to the allowable setting range 2402 to be 500 mm, and a gap g3 from a roof boundary 2405 to the allowable setting range 2402 to be 500 mm. The setting procedure will be briefly described below.

[Calculation of Maximum Setting Number of Lines]

In this embodiment, the frame mounted solar battery modules 2403 are arranged such that the short sides of each module are perpendicular to the roof inclination direction. A length A of the allowable setting range 2402 in the inclination direction is given by:

$A = 5,000 - 500 = 4,500$ mm

The number C of lines is given by the following inequality, and a maximum setting number Cmax is 4.

$C \leq A/$(length of frame mounted solar battery module in longitudinal direction)

$C \leq 4,500/1,100 = 4.1$

[Calculation of Maximum Setting Number for Each Line (Step S4)]

Letting B be the common length of the upper- and lower-side module lines, a maximum setting number Nmax is given by the maximum integer satisfying the following inequality:

$N \leq B/$(length of frame mounted solar battery module in widthwise direction)

Since a roof setting surface 2401 is rhombic, all lines have the same value B which is given by:

$$B=8,000-1,000-822\times4/5=6,342$$

Therefore, from the following inequality, the maximum setting number Nmax is 7 for all lines.

$$\text{Nmax} \leq 6,342/822=7.7$$

[Arrangement at Central Portion of Setting Surface (Step S5)]

Frame mounted solar battery modules 2403 which have the maximum setting number and are calculated above are arranged at the central portion of the respective lines of the roof setting surface 2401.

In FIG. 24, the short sides of modules of a certain line are shifted from the short sides of modules of the next line in the horizontal direction. From this viewpoint, this arranging method can be more sufficiently exploited for roofing material integrated solar battery modules for a stepping roof in which modules can be relatively freely shifted than for frame mounted solar battery modules.

[Seventh Embodiment]

A solar battery array is constituted by connecting in parallel a plurality of solar battery strings each formed by connecting a plurality of solar battery modules in series. If the number of modules which are connected in series to form each solar battery string varies, an output loss is generated. In the first embodiment, the maximum setting number is 74. When the solar battery array is designed assuming connection of an S102 inverter available from CANON INC., the number of series-connected solar battery modules can be selected from five different values: 15, 16, 17, 18, and 19. The number of solar battery modules is maximized to 72 in the combination of 18 series-connected and 4 parallel-connected solar battery modules. However, when a solar battery array is constituted by the 72 solar battery modules, the number of solar battery modules becomes smaller than the maximum setting number of 74 by two.

However, a connecting method called "series connection of different numbers of modules", i.e., a connecting method for parallelly connecting solar battery strings whose numbers of series-connected solar battery modules are different is used, a solar battery array can sometimes be constituted using 18 series-connected×2 parallel-connected+19 series-connected×2 parallel-connected solar battery modules. This combination is possible when an increase in output power due to two more solar battery modules is larger than the output loss due to mismatch between the numbers of series-connected modules. In the first embodiment, the substantial roof occupation ratio increases from 75.3% to 77.4%, and the output power of the solar battery array also increases.

According to the above-described embodiments, in the arranging method for arranging solar battery modules having a rectangular form on a roof setting surface, an arbitrary module setting direction is determined, the maximum arrangement number of solar battery modules is calculated in units of lines in that direction, and solar battery modules having the maximum arrangement number are arranged at the central portion of the roof setting surface in units of lines, thereby increasing the roof occupation ratio of the solar battery modules. In addition, the arranging method for arranging solar battery modules on a roof surface without degrading the outer appearance of the roof can be provided.

As many apparently widely different embodiments of the present invention can be made without departing from the spirit and scope thereof, it is to be understood that the invention is not limited to the specific embodiments thereof except as defined in the appended claims.

What is claimed is:

1. An arranging method for arranging solar battery modules having a rectangular form and same size on a surface which is asymmetrical in a horizontal direction comprising the steps of:

determining an arrangement range in which the solar battery modules can be arranged on the horizontally asymmetric surface;

determining an arranging direction of the solar battery modules;

calculating the number of solar battery modules which can be arranged substantially horizontally in a line in the determined arranging direction and within the arrangement range;

combining solar battery modules of a line in a number not more than the calculated number to form a solar battery module group; and arranging the solar battery module group so as to set its center within the determined arrangement range and near a line which passes through the horizontal center of the determined arrangement range.

2. The method according to claim 1, further comprising the step of calculating the number of lines of solar battery module groups which can be arranged substantially vertically in the determined arranging direction and within the arrangement range, wherein the horizontal-direction calculation step, the combining step, and the arranging step are repeated a number of times not more than the calculated number of lines.

3. An arranging method for arranging solar battery modules having a rectangular form and same size on a surface, comprising the steps of:

determining an arrangement range in which the solar battery modules can be arranged on the surface;

determining an arranging direction of the solar battery modules;

calculating the number of solar battery modules which can be arranged substantially horizontally in a line in the determined arranging direction and within the arrangement range;

combining solar battery modules of a line in a number not more than the calculated number to form a solar battery module group;

arranging the solar battery module group so as to set the center of the solar battery module group within the determined arrangement range and near a line substantially vertically dividing the surface into two parts;

calculating the number of lines of solar battery module groups which can be arranged substantially vertically in the determined arranging direction and within the arrangement range;

repeating the horizontal-direction calculation step, the combining step, and the arranging step a number of times not more than the calculated number of lines;

substantially horizontally shifting centers of solar battery module groups alternately to left and right sides with respect to the line dividing the surface into two parts by a distance;

removing a solar battery module of a solar battery module group, which projects from the arrangement range in the shifting step; and rearranging the solar battery module group from which the solar battery module is removed to set the center of the solar battery module group near the line dividing the surface into two parts and to shift its center by a distance with respect to the center of an adjacent solar battery module group.

4. An array of solar battery modules having a rectangular form and same size which is arranged on a surface by the arranging method according to claim 3, wherein said solar battery modules are electrically connected.

5. The array according to claim 4, wherein a plurality of strings each formed by connecting said solar battery modules in series, and an array in which said plurality of strings are connected in parallel are formed by electrical connection.

6. The array according to claim 5, wherein at least one of said plurality of strings has solar battery modules in a number different from that in remaining strings.

7. The array according to claim 4, wherein said solar battery modules are integrated with a building material.

8. A solar panel roof comprising solar battery modules having a rectangular form and same size arranged by the arranging method according to claim 3.

9. The roof according to claim 8, wherein a general roofing material is arranged on a roof surface where no solar battery module is arranged.

10. The roof according to claim 8, wherein said solar battery modules are integrated with a building material.

11. The roof according to claim 10, wherein the form of said solar battery modules integrated with the building material is adapted to a stepping roof.

12. A solar generation apparatus comprising the array of solar battery modules according to claim 4; and a power conversion unit which converts direct current power provided from said array to alternating power.

13. An array of solar battery modules having a rectangular form and same size arranged on a face which is asymmetrical in a horizontal direction, wherein said solar battery modules are arranged on the horizontally asymmetric face to form a plurality of lines substantially in a horizontal direction, the center of each line being set near a line which passes through the horizontal center of the face, and wherein said solar battery modules partially have portions where shift substantially in the horizontal direction is irregular.

14. An array of solar battery modules having a rectangular form and same size arranged on a face which is asymmetrical in a horizontal direction, wherein said solar battery modules are arranged on the horizontally asymmetric face to form a plurality of lines substantially in a horizontal direction, the center of each line being set near a line which passes through the horizontal center of the face, and wherein the position of a horizontal side of each solar battery module of at least one line is shifted with respect to the position of a horizontal side of each solar battery module of an adjacent line substantially in the horizontal direction.

15. An arranging method for arranging solar battery modules having a rectangular form and same size on a surface comprising the steps of:

determining an arrangement range in which the solar battery modules can be arranged on the surface;

determining an arranging direction of the solar battery modules;

calculating the number of solar battery modules which can be arranged substantially horizontally in a line in the determined arranging direction and within the arrangement range;

combining solar battery modules of a line in a number not more than the calculated number to form a solar battery module group;

arranging the solar battery module group so as to set its center within the determined arrangement range and near a line substantially vertically dividing the surface into two parts;

calculating the number of lines of solar battery module groups which can be arranged substantially vertically in the determined arranging direction and within the arrangement range;

repeating the horizontal-direction calculation step, the combining step, and the arranging step a number of times not more than the calculated number of lines;

substantially horizontally shifting centers of solar battery module groups alternately to left and right sides with respect to the line dividing the surface into two parts by a distance so that joints of the solar battery modules of a solar battery module group are shifted from that of an adjacent solar battery module group;

removing a solar battery module of a solar battery module group which projects from the arrangement range in the shifting step; and rearranging the solar battery module group from which the solar battery module is removed to set the center of the solar battery module group near the line dividing the surface into two parts.

16. An array of solar battery modules having a rectangular form and same size which is arranged on a surface by the arranging method according to claim 15, wherein said solar battery modules are electrically connected.

17. The array according to claim 16, wherein a plurality of strings each formed by connecting the solar battery modules in series, and an array in which the plurality of strings are connected in parallel are formed by electrical connection.

18. The array according to claim 17, wherein at least one of said plurality of strings has solar battery modules in a number different from that in remaining strings.

19. The array according to claim 16, wherein said solar battery modules are integrated with a building material.

20. A solar panel roof comprising solar battery modules having a rectangular form and same size by the arranging method according to claim 15.

21. The roof according to claim 20, wherein a general roofing material is arranged on a roof surface where no solar battery module is arranged.

22. The roof according to claim 20, wherein the solar battery modules are integrated with a building material.

23. The roof according to claim 22, wherein the form of the solar battery modules integrated with the building material is adapted to a stepping roof.

24. A solar generation apparatus comprising the array of solar battery modules according to claim 16 and a power conversion unit which converts direct current power provided from the array to alternating power.

25. An array of solar battery modules having a rectangular form and same size arranged on a roof-setting surface which is asymmetrical in a horizontal direction, wherein said solar battery modules are arranged on the horizontally asymmetric surface to form a plurality of lines substantially in a horizontal direction, the center of each line being set near a central line which passes through the center of common length of upper and lower-side module lines in a range of the roof-setting surface where said solar battery modules can be set, and wherein said solar battery modules partially have portions where shift substantially in the horizontal direction is irregular.

26. An arranging method for arranging solar battery modules having a rectangular form and same size on a roof-setting surface comprising the steps of:

determining an arrangement range in which the solar battery modules can be arranged on the surface;

determining an arranging direction of the solar battery modules;

calculating the number of solar battery modules which can be arranged substantially horizontally in a line in the determined arranging direction and within the arrangement range;

combining solar battery modules of a line in a number not more than the calculated number to form a solar battery module group;

arranging the solar battery module group so as to set its center within the determined arrangement range and near a central line which passes through the center of common length of upper and lower-side module lines in the determined arrangement range;

calculating the number of lines of solar battery module groups which can be arranged substantially vertically in the determined arranging direction and within the arrangement range;

repeating the horizontal-direction calculation step, the combining step, and the arranging step a number of times not more than the calculated number of lines;

substantially horizontally shifting centers of solar battery module groups alternately to left and right sides with respect to the central line so that joints of the solar battery modules of a solar battery module group are shifted from that of an adjacent solar battery module group;

removing a solar battery module of a solar battery module group which projects from the arrangement range in the shifting step; and rearranging the solar battery module group from which the solar battery module is removed to set the center of the solar battery module group near the line dividing the surface into two parts.

27. An array of solar battery modules having a rectangular form and same size arranged on a roof-setting surface which gradually becomes narrower, wherein said solar battery modules are arranged on the roof-setting surface to form a plurality of lines substantially in a horizontal direction, the center of each line being set near a central line which passes through the center of common length of upper and lower-side module lines in a range of the roof-setting surface where said solar battery modules can be set, wherein joints of said solar battery modules of a line shift from that of said solar battery modules of an adjacent line and the joints do not form vertical lines in a range of the plurality of lines, and wherein said array has at least one section where said solar battery modules of a line are irregularly shifted.

28. An array of solar battery modules having a rectangular form and same size arranged on a roof-setting surface which gradually becomes narrower, wherein said solar battery modules are arranged on the roof-setting surface to form a plurality of lines substantially in a horizontal direction, the center of each line being set near a central line which passes through the center of common length of upper and lower-side module lines in a range of the roof-setting surface where said solar battery modules can be set, wherein joints of said solar battery modules of a line are always shifted with respect to that of said solar battery modules of an adjacent line so that the positions of the joints of each line differ from that of the adjacent line and wherein said array has at least one section where said solar battery modules of a line are irregularly shifted.

* * * * *

UNITED STATES PATENT AND TRADEMARK OFFICE
CERTIFICATE OF CORRECTION

PATENT NO.    : 6,534,702 B1
DATED         : March 18, 2003
INVENTOR(S)   : Hidehisa Makita et al.

It is certified that error appears in the above-identified patent and that said Letters Patent is hereby corrected as shown below:

<u>Title page,</u>
Item [*] Notice, insert -- This patent issued on a continued prosecution application filed under 37 CFR 1.53(d), and is subject to the twenty year patent term provisions of 35 U.S.C. 154(a)(2). --.

<u>Column 6,</u>
Line 57, "an" should read -- a --.

<u>Column 7,</u>
Line 66, "need" should read -- need to --.

<u>Column 13,</u>
Line 36, "has" (first occurrence) should read -- have --; and
Line 55, "g2+1,390" should read -- g2=1,390 --.

<u>Column 20,</u>
Line 30, "line" should read -- line, --.

Signed and Sealed this

Twenty-fifth Day of November, 2003

JAMES E. ROGAN
*Director of the United States Patent and Trademark Office*